(12) United States Patent
Maki

(10) Patent No.: US 6,753,731 B2
(45) Date of Patent: Jun. 22, 2004

(54) OPERATION AMPLIFIER CIRCUIT, DRIVE CIRCUIT AND METHOD OF CONTROLLING OPERATION AMPLIFIER CIRCUIT

(75) Inventor: Katsuhiko Maki, Chino (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/356,353

(22) Filed: Jan. 30, 2003

(65) Prior Publication Data

US 2003/0146788 A1 Aug. 7, 2003

(30) Foreign Application Priority Data

Feb. 4, 2002 (JP) .................................. 2002-026558

(51) Int. Cl.$^7$ .............................................. H03F 3/45
(52) U.S. Cl. ..................................... 330/255; 330/253
(58) Field of Search ................................ 330/255, 253, 330/257, 261; 327/354

(56) References Cited

U.S. PATENT DOCUMENTS 6,384,685 B1 * 5/2002 Juang ........................ 330/264
6,567,327 B2 * 5/2003 Tsuchi ....................... 365/203
6,617,924 B2 * 9/2003 Suzuki ....................... 330/255

* cited by examiner

Primary Examiner—Henry Choe
(74) Attorney, Agent, or Firm—Hogan & Hartson, LLP

(57) ABSTRACT

An operational amplifier circuit includes a differential section, an output section having drive transistors PT15 and NT15, a voltage setting circuit which sets a programming voltage at a node N1, and a capacitance element C1. The programming voltage is set to the node N1, and then a change in voltage at an output node NQ1 of the differential section is transferred to the node N1 by the capacitance element C1. Switching elements SW1 and SW2 are turned off before the programming voltage is set to the node N1, and are turned on after the setting. A switching element SW4 is turned on and the node N1 is set to VSS, and subsequently the node N1 is set to the programming voltage (VDD−VTH) by turning on the switching element SW3. The programming voltage is set in a switching period between scan periods.

27 Claims, 18 Drawing Sheets

DATA LINE DRIVE CIRCUIT (SOURCE DRIVER)

SCAN LINE DRIVE CIRCUIT (GATE DRIVER)

FIG. 4

| METHOD | FRAME INVERSION | SCAN LINE INVERSION | DATA LINE INVERSION | DOT INVERSION |
|---|---|---|---|---|
| | + + + + + +<br>+ + + + + +<br>+ + + + + +<br>+ + + + + +<br>+ + + + + +<br>+ + + + + +<br>+ + + + + + | + − + − + −<br>+ − + − + −<br>+ − + − + −<br>+ − + − + −<br>+ − + − + −<br>+ − + − + −<br>+ − + − + − | + + + + + +<br>− − − − − −<br>+ + + + + +<br>− − − − − −<br>+ + + + + +<br>− − − − − −<br>+ + + + + + | + − + − + −<br>− + − + − +<br>+ − + − + −<br>− + − + − +<br>+ − + − + −<br>− + − + − +<br>+ − + − + − |
| IMAGE QUALITY | ▲ | ○ | ○ | ◎ |
| CURRENT CONSUMPTION | ◎ | ○ | ▲ | ▲ |
| VOLTAGE | LOW VOLTAGE (VCOM INVERSION) | LOW VOLTAGE (VCOM INVERSION) | HIGH VOLTAGE (VCOM CONSTANT) | HIGH VOLTAGE (VCOM CONSTANT) |

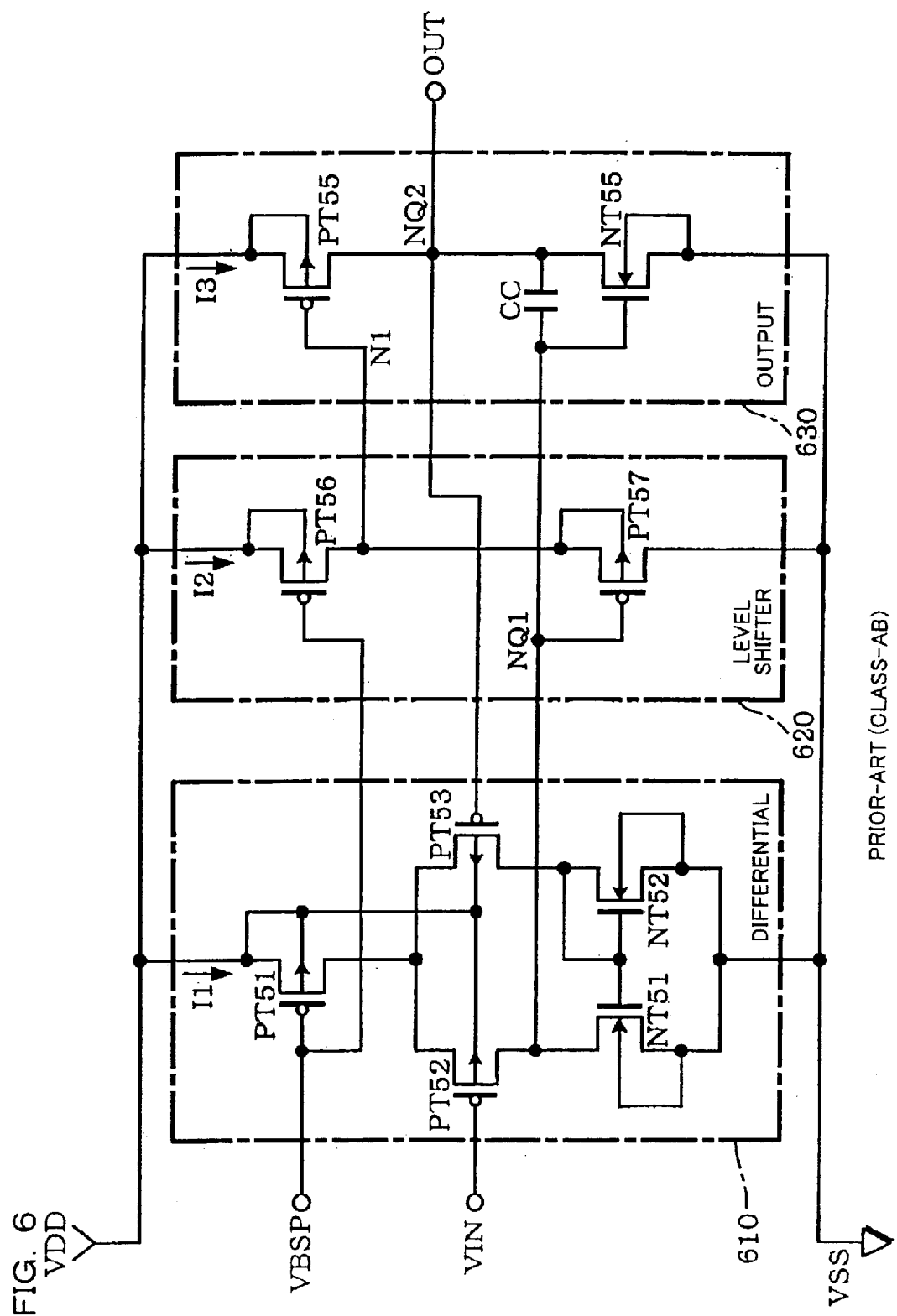
FIG. 6 PRIOR-ART (CLASS-AB)

OPERATION AMPLIFIER CIRCUIT, DRIVE CIRCUIT AND METHOD OF CONTROLLING OPERATION AMPLIFIER CIRCUIT

Japanese Patent Application No. 2002-26558, filed on Feb. 4, 2002, is hereby incorporated by reference in its entirety.

BACKGROUND

The present invention relates to an operational amplifier circuit, a drive circuit, and a method of controlling an operational amplifier circuit.

A liquid-crystal panel operated by a simple-matrix method and a liquid-crystal panel operated by an active-matrix method using switching elements such as thin-film transistors (hereinafter abbreviated to TFTs) are known in the art as liquid-crystal panels (electro-optical devices) for use in electronic appliances such as mobile phones.

The simple-matrix method has the advantage of a low power consumption in comparison with the active-matrix method, but it has a disadvantage in that it makes it difficult to display multiple colors and moving images. The active-matrix method, on the other hand, has the advantage of enabling multiple colors and moving-image displays, but has a disadvantage in that it is difficult to reduce the power consumption.

Demands for multiple colors and moving-image displays have recently increased, in order to provide high-quality images in portable electronic appliances such as mobile phones. For that reason, it is becoming common to use an active-matrix method liquid-crystal panel instead of the simple-matrix method liquid-crystal panel that has been used up to now.

With an active-matrix method liquid-crystal panel, it is preferable to provide an operational amplifier circuit (op-amp) that functions as an output buffer, in the data line drive circuit that drives the data lines of the display panel. In the conventional art, it has become common to use a class-AB (push-pull system) operational amplifier circuit as this operational amplifier circuit.

However, the conventional class-AB operational amplifier circuit has a defect in that there is a large number of paths along which the current flows, so there a lot of current is consumed wastefully and thus the power consumption is large. If an attempt is make to throttle the current to reduce power consumption, that could lead to a state in which the response speed drops and the frequency characteristic deteriorates.

SUMMARY

An aspect of the present invention relates to an operational amplifier circuit comprising:

a differential section which amplifies a differential value of differential signals;

an output section including a first drive transistor of a first conductivity type and a second drive transistor of a second conductivity type, the first drive transistor being provided on a first power source side, the second drive transistor being provided in series with the first drive transistor and provided on a second power source side, and a gate electrode of the second drive transistor being controlled based on a voltage at an output node of the differential section;

a voltage setting circuit which sets a given first voltage to a first node connected to a gate electrode of the first drive transistor; and a first capacitance element provided between an output node of the differential section and the first node, wherein the voltage setting circuit sets the first voltage to the first node, and then the first capacitance element transfers a voltage change at the output node of the differential section to the first node.

BRIEF DESCRIPTION OF THE SEVERAL VIEWS OF THE DRAWING

FIG. 4 is illustrative of various inversion drive methods for liquid-crystal devices;

FIG. 6 shows an example of the structure of a conventional class-AB operational amplifier circuit;

DETAILED DESCRIPTION

Figure 1:
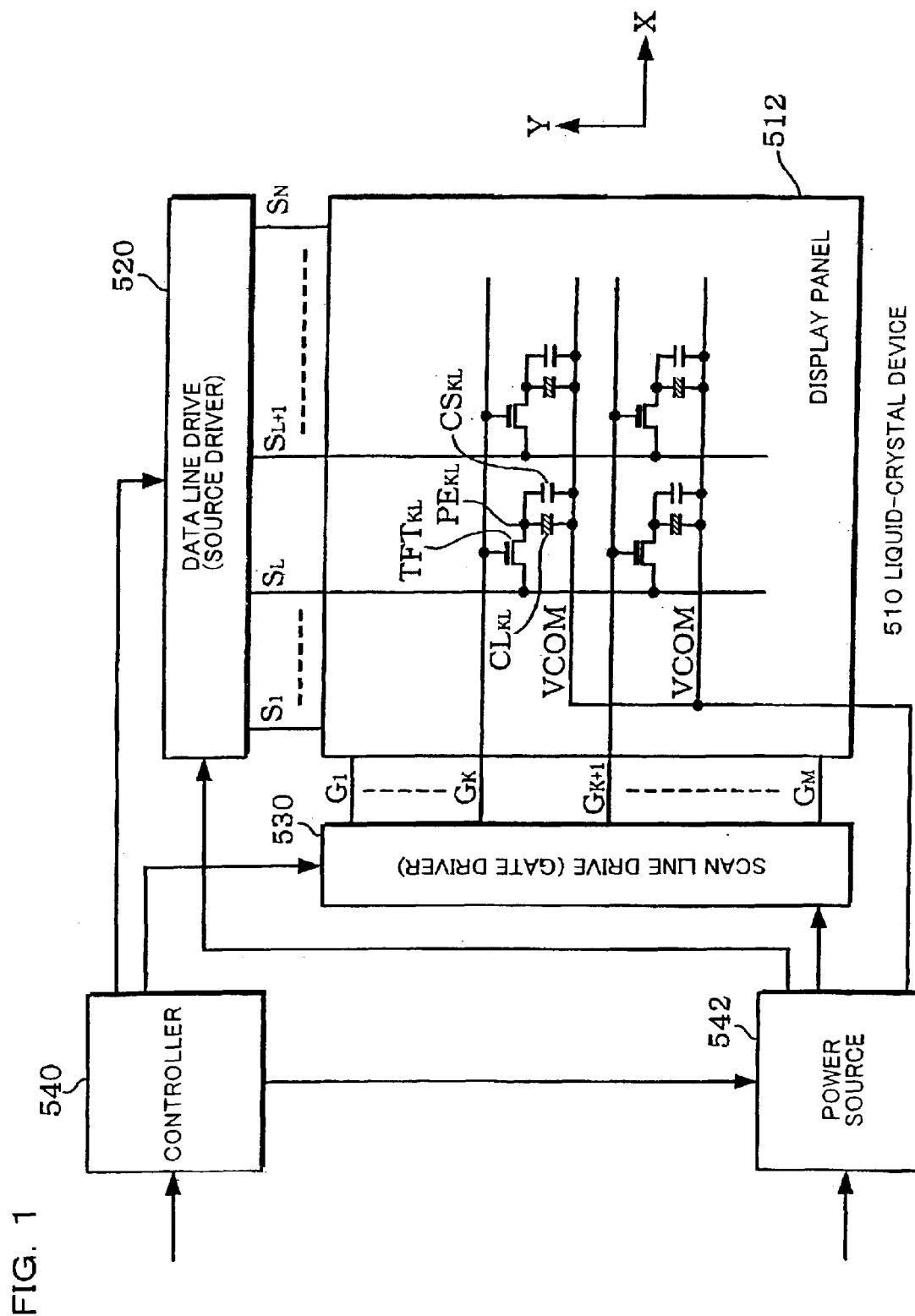
FIG. 1 is a block diagram of an example of the structure of a liquid-crystal device.

Embodiments of the present invention are described below.

Note that these embodiments that are described below do not in any way limit the scope of the present invention as laid out in the claims herein. In addition, the entirety of the configuration described with reference to these embodiments should not be taken as essential structural components of the present invention.

One embodiment of the present invention relates to an operational amplifier circuit comprising:

a differential section which amplifies a differential value of differential signals;

an output section including a first drive transistor of a first conductivity type and a second drive transistor of a second conductivity type, the first drive transistor being provided on a first power source side, the second drive transistor being provided in series with the first drive transistor and provided on a second power source side, and a gate electrode of the second drive transistor being controlled based on a voltage at an output node of the differential section;

a voltage setting circuit which sets a given first voltage to a first node connected to a gate electrode of the first drive transistor; and a first capacitance element provided between an output node of the differential section and the first node, wherein the voltage setting circuit sets the first voltage to the first node, and then the first capacitance element transfers a voltage change at the output node of the differential section to the first node.

In this embodiment, a voltage setting circuit sets a first voltage (such as a voltage obtained from a threshold voltage) to a first node that is connected to the gate electrode of a first drive transistor of a first conductivity type (such as p-type or n-type). Then, a change in voltage at the output node of the differential section is transferred to the first node through the first capacitance element. This configuration makes it possible to apply a voltage, which is the first voltage with the voltage change at the output node of the differential section superimposed thereon, to the gate electrode of the first drive transistor. This enables the implementation of an operational amplifier circuit that is capable of class-AB operation at a low power consumption.

Note that other components (such as switching elements) could be provided between the drain electrodes of the first and second drive transistors, between the output node of the differential section and the first capacitance element, and between the output node of the differential section and the gate electrode of the second drive transistor. The first differential signal that is input to the differential section could be an input signal from a previous-stage circuit and the second differential signal could be an output signal from the output section.

With this embodiment, the voltage setting circuit may include:

a first switching element provided between an output node of the differential section and the first capacitance element; and a second switching element provided between a drain electrode of the first drive transistor and an output node of the output section, and the first and second switching elements may be turned off before the first voltage is set to the first node and turned on after the first voltage is set to the first node.

This makes it possible to set the first voltage to the first node in a suitable manner.

With this embodiment, the voltage setting circuit may include a third switching element provided between the first node and a drain electrode of the first drive transistor, and the first voltage may be set to the first node by turning on the third switching element.

This makes it possible to set a voltage that is generated by the connection of the gate electrode and the drain electrode of the first drive transistor to the first node as the first voltage.

Note that the voltage setting circuit may generate a given voltage (constant voltage) and the thus-generated voltage can be set to the first node as the first voltage.

With this embodiment, the voltage setting circuit may include a fourth switching element provided between the first node and the second power source, and a voltage of the second power source may be set to the first node by turning on the fourth switching element, and then the fourth switching element may be turned off and the third switching element is turned on.

In such as case, a single fourth switching element could be provided in common for a plurality of operational amplifier circuits.

Note that a switching control circuit could be provided to control the switching on and off of the first to fourth switching elements With this embodiment, a second capacitance element may be provided between the first power source and the first node.

Note that the gate capacitance of the first drive transistor could be substituted instead of the second capacitance element.

With this embodiment, the first voltage may be a voltage obtained based on a threshold voltage of a transistor of the first conductivity type.

In such a case, the generation of the first voltage could be based on the threshold voltage of the first drive transistor, or based on the threshold voltage of another transistor of the first conductivity type.

Another embodiment of the present invention relates to a drive circuit which drives an electro-optical device having a plurality of scan lines, a plurality of data lines and pixel electrodes specified by the data lines and the scan lines, and the drive circuit comprising:

the operational amplifier circuit as defined by claim 1, provided for each of the data lines; and a data voltage generation circuit provided for each of the data lines, the data voltage generation circuit generating a data voltage which is impedance-converted by the operational amplifier circuit, wherein the setting of the first voltage to the first node of the operational amplifier circuit is executed during a switching period from a K-th scan period to a (K+1) th scan period.

In such a case, the voltage of an opposing electrode (an electrode facing the pixel electrode with an electro-optical substance therebetween) could be made to invert for every one or plurality of scan lines (scan period).

With this embodiment, an output node of the operational amplifier circuit could be set to a high-impedance state in the switching period.

The setting to a high-impedance state in this manner could be implemented by providing a sixth switching element (such as a transfer gate) between the output node of the output section (operational amplifier circuit) and the data line, and turning this sixth switching element on and off during the switching period.

An embodiment of the present invention is described in detail below, with reference to the accompanying figures.

1. Liquid-Crystal Device

A block diagram of a liquid-crystal device to which the operational amplifier circuit of this embodiment is applied is shown in FIG. 1.

This liquid-crystal device 510 (broadly speaking: a display device) includes a display panel 512 (in a narrow sense: a liquid-crystal display (LCD) panel), a data line drive circuit 520 (in a narrow sense: a source driver), a scan line drive circuit 530 (in a narrow sense: a gate driver), a controller 540, and a power source circuit 542. Note that not all of these circuit blocks are necessary for this liquid-crystal device 510, and thus it is possible to have a configuration in which some of these circuit blocks are omitted.

In this case, the display panel 512 (broadly speaking: a electro-optical device) includes a plurality of scan lines (in a narrow sense: gate lines), a plurality of data lines (in a narrow sense: source lines), and pixel electrodes specified by the scan lines and data lines. These data lines are connected to thin-film transistors (TFTs; broadly speaking: switching elements), and an active-matrix type of liquid-crystal device can be configured by connecting those TFTs to pixel electrodes.

More specifically, the display panel 512 is formed of an active-matrix substrate (such as a glass substrate). On this active-matrix substrate are disposed a plurality of scan lines $G_1 1$ to $G_M$ (where M is a natural number greater than or equal to 2), which are arranged in the Y direction in FIG. 1 and extend in the X direction, and data line $S_1$ to $S_N$ (where N is a natural number greater than or equal to 2), which are arranged in the X direction and extend in the Y direction. A thin-film transistor $TFT_{KL}$ (broadly speaking: a switching element) is provided at a position corresponding to an intersection point between a scan line $G_K$ ($1 \leq K \leq M$, where K is a natural number) and a data line $S_L$ ($1 \leq L \leq N$, where L is a natural number).

The gate electrode of $TFT_{KL}$ is connected to the scan line $G_K$, the source electrode of $TFT_{KL}$ is connected to the data line $S_L$, and the drain electrode of $TFT_{KL}$ is connected to a pixel electrode $PE_{KL}$. A liquid-crystal capacitor $CL_{KL}$ (liquid-crystal element) and a supplementary capacitor $CS_{KL}$ are formed between this pixel electrode $PE_{KL}$ and an opposing electrode VCOM (common electrode) that faces the pixel electrode $PE_{KL}$ with a liquid-crystal element (broadly speaking: a electro-optical substance) interposed therebetween. A liquid crystal is inserted between the active-matrix substrate, on which are formed components such as $TFT_{KL}$ and the pixel electrode $PE_{KL}$, and an opposing substrate on which is formed the opposing electrode VCOM, with the configuration being such that the transmittance of the liquid-crystal element varies in accordance with a voltage applied to the pixel electrode $PE_{KL}$ and the opposing electrode VCOM.

Note that the voltages (first and second common voltages) applied to the opposing electrode VCOM are generated by the power source circuit 542. The opposing electrode VCOM could be formed in a strip corresponding to each scan line, instead of being formed over the opposing substrate.

The data line drive circuit 520 drives the data lines $S_1$ to $S_N$ of the display panel 512 based on image data. The scan line drive circuit 530, on the other hand, drives the scan lines $G_1$ to $G_M$ of the display panel 512 sequentially.

The controller 540 controls the data line drive circuit 520, the scan line drive circuit 530, and the power source circuit 542 in accordance with details set by a host, such as a central processing unit (CPU, not shown in the figures).

More specifically, the controller 540 supplies data such as an operating mode setting and internally generated vertical and horizontal synchronization signals to the data line drive, circuit 520 and the scan line drive circuit 530, and controls the timing at which the voltage of the opposing electrode VCOM reverses polarity.

The power source circuit 542 generates the various voltages (grayscale voltages) necessary for driving the display panel 512 and the voltage for the opposing electrode VCOM, based on a reference voltage that is supplied from the outside.

Note that the liquid-crystal device 510 of FIG. 1 is configured to include the controller 540, but the controller 540 could also be provided outside of the liquid-crystal device 510. Alternatively, the configuration could be such that the host is included within the liquid-crystal device 510 together with the controller 540. All or part of the data line drive circuit 520, the scan line drive circuit 530, the controller 540, and the power source circuit 542 could be provided on the display panel 512.

1.1 Data Line Drive Circuit

Figure 2:
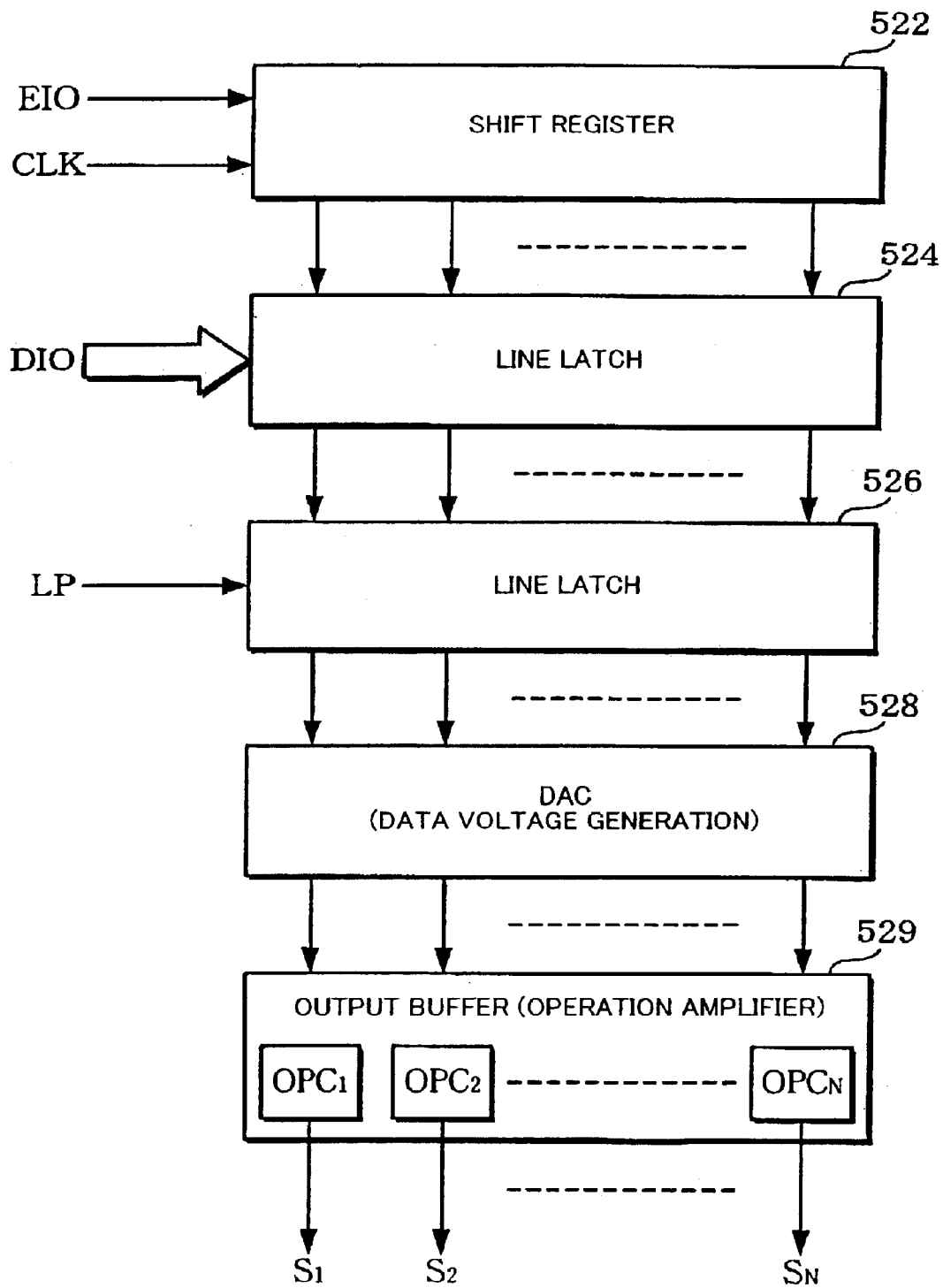
FIG. 2 is a block diagram of an example of the structure of a data line drive circuit.

An example of the structure of the data line drive circuit 520 of FIG. 1 is shown in FIG. 2.

The data line drive circuit 520 includes a shift register 522, line latches 524 and 526, a digital-to-analog (DAC) conversion circuit 528 (broadly speaking: a data voltage generation circuit), and an output buffer 529 (operational amplifier circuit).

One shift register 522 is provided corresponding to each data line, and includes a plurality of flip-flops connected sequentially. When this shift register 522 holds an enable input-output signal EIO in synchronization with a clock signal CLK, the enable input-output signal EIO is shifted in adjacent flip-flops in synchronization with the clock signal CLK.

Image data (DIO) in units such as 18 bits (6 bits of grayscale data×3 colors of RBG) is input to the line latch 524 from the controller 540. The line latch 524 latches this image data (DIO) in synchronization with the enable input-output signal EIO that is sequentially shifted through the flip-flops of the shift register 522.

The line latch 526 latches image data for one horizontal scan unit, which has been latched by the line latch 524, in synchronization with a horizontal synchronization signal LP supplied from the controller 540.

The DAC 528 generates analog data voltages to be supplied to the data lines. More specifically, the DAC 528 selects one grayscale voltage from the power source circuit 542 of FIG. 1, based on digital image data from the line latch 526, and outputs analog data voltages corresponding to the digital image data.

The output buffer 529 buffers data voltages from the DAC 528 and outputs them to the data lines to drive the data lines. More specifically, the output buffer 529 includes operational amplifier circuits $OPC_1$ to $OPC_N$ that are provided for each data line and are voltage-follower-connected and, these operational amplifier circuits $OPC_1$ to $OPC_N$ convert the impedances of the data voltage from the DAC 528 and outputs them to the data lines.

Note that the configuration in FIG. 2 is such that digital image data is converted into analog form and is output through the output buffer 529 to the data lines, but the configuration could also be such that an analog image signal is sampled and held then is output through the output buffer 529 to the data lines.

1.2 Scan Line Drive Circuit

Figure 3:
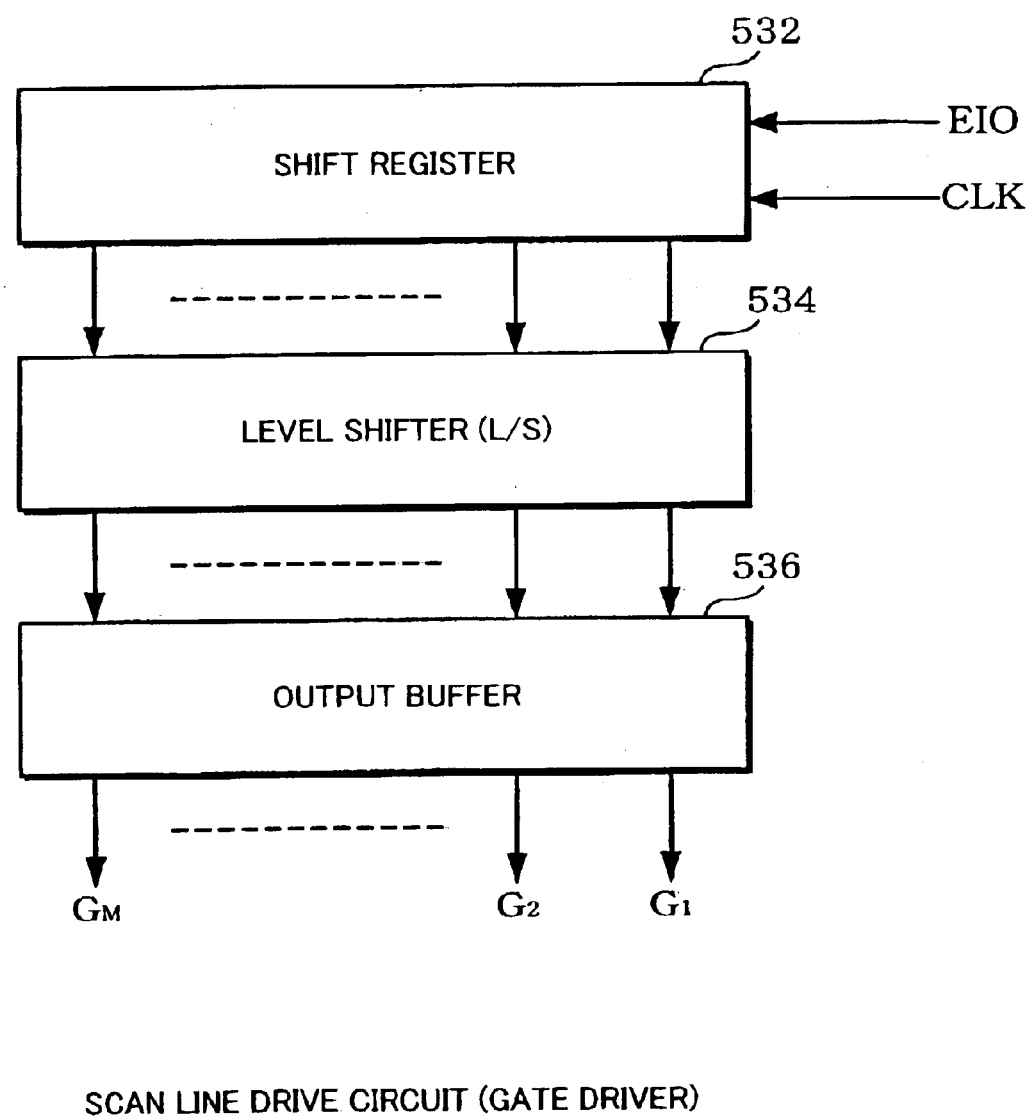
FIG. 3 is a is a block diagram of an example of the structure of a scan line drive circuit.

An example of the structure of the scan line drive circuit 530 of FIG. 1 is shown in FIG. 3.

The scan line drive circuit 530 includes a shift register 532, a level shifter 534, and an output buffer 536.

One shift register 532 is provided for each scan line, and includes a plurality of flip-flops connected sequentially. When this shift register 532 holds the enable input-output signal EIO in synchronization with the clock signal CLK, the enable input-output signal EIO is shifted in adjacent flip-flops in synchronization with the clock signal CLK. In this case, the input enable input-output signal EIO is the vertical synchronization signal supplied from the controller 540.

The level shifter 534 shifts the levels of voltages from the shift register 532, to a level appropriate for the capabilities of the liquid-crystal elements and TFT transistors of the display panel 512. It is necessary to use a high voltage level of 20 to 50 V, by way of example.

The output buffer 536 buffers the scan voltage that has been shifted by the level shifter 534, for output to the scan lines to drive the scan lines.

2. Operation Amplifier Circuit 2.1 Inversion Drive

It is the nature of liquid-crystal elements to deteriorate under the long-term application of DC voltages. For that reason, it is necessary to use a drive method in which the polarity of the voltage applied to each liquid-crystal element is inverted every predetermined period. There are several such drive methods, such as frame inversion drive, scan (gate) line inversion drive, data (source) line inversion drive, and dot inversion drive, as shown in FIG. 4.

In this case, scan line inversion drive is used to invert the polarity of the voltage applied to each liquid-crystal element every scan period (every one or a plurality of scan lines). For example, a positive-polarity voltage is applied to the liquid-crystal element in a K-th scan period (a period during which a K-th scan line is selected), a negative-polarity voltage is applied during the (K+1)th scan period, and a positive-polarity voltage is applied during the (K+2)th scan period. In the next frame, on the other hand, a negative-polarity voltage is applied during the K-th scan period, a positive-polarity voltage is applied during the (K+1)th scan period, and a negative-polarity voltage is applied during the (K+2)th scan period.

This scan line inversion drive causes polarity inversions of the voltage of the opposing electrode VCOM in each scan period.

More specifically, the voltage of the opposing electrode VCOM is VC1 (a first common voltage) in a positive-polarity period T1 (a first period) and VC2 (a second common voltage) in a negative-polarity period T2 (a second period).

In this case, the positive-polarity period T1 is a period during which the voltage on the data line S (pixel electrode) is higher than the voltage of the opposing electrode VCOM. Within this period T1, a positive-polarity voltage is applied to the liquid-crystal element. During the negative-polarity period T2, on the other hand, the voltage of the data line S is lower than the voltage of the opposing electrode VCOM. Within this period T2, a negative-polarity voltage is applied to the liquid-crystal element. VC2 is a voltage that is of the opposite polarity to VC1, with reference to a given voltage.

This inversion of the polarity of VCOM makes it possible to reduce the voltages required for driving the display panel. This enables a reduction in the withstand voltage of the drive circuit, simplifying the drive circuit fabrication process and reducing the cost thereof.

However, this method of inverting the polarity of VCOM raises a technical problem from the viewpoint of reducing the power consumption of the circuit, as described below.

Figure 5:
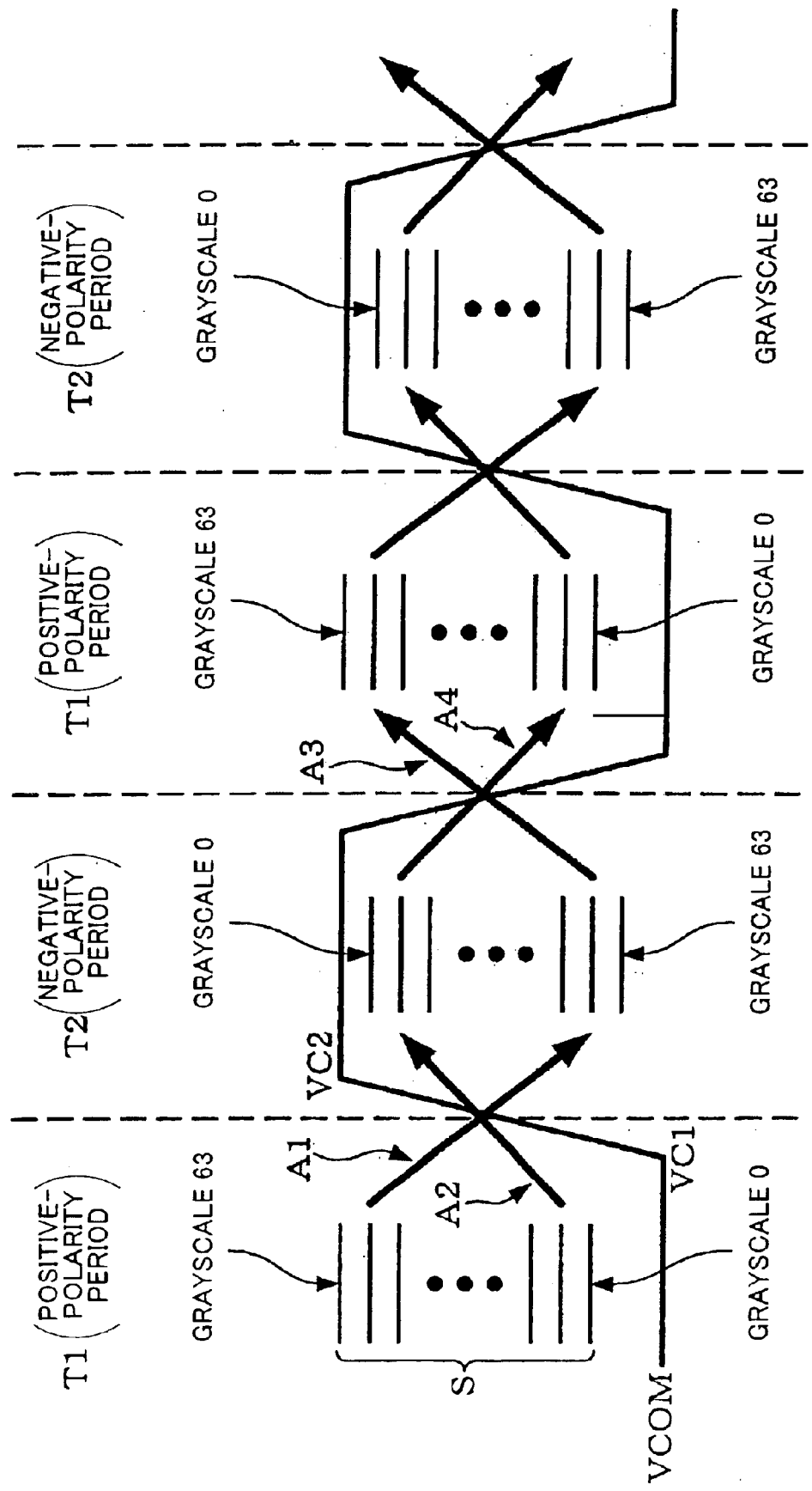
FIG. 5 is a timing waveform chart of changes in voltage levels in the opposing electrode and data lines.

During the switchover from the period T1 to the period T2, as shown by way of example at A1 and A2 in FIG. 5, the voltage of the data line S could change to the low-potential side (A1) and also it could change toward the high-potential side (A2). Similarly, during the switchover from the period T2 to the period T1, as shown by way of example at A3 and A4 in FIG. 5, the voltage of the data line S could change toward the high-potential side (A3) and also it could change toward the low-potential side (A5).

If the grayscale on the data line S is 63 in the period T1 and it is also 63 in the period T2, by way of example, the voltage of the data line S will change to the low-potential side at A1 in FIG. 5. If the grayscale on the data line S is 0 in the period T1 and is also 0 in the period T2, the voltage of the data line S will change to the high-potential side.

Thus, if the polarity of VCOM inverts in this active-matrix type of liquid-crystal device, the direction in which the voltage of the data line S changes is dependent on grayscale level.

For that reason, a class-AB (push-pull system) operational amplifier circuit of the configuration shown in FIG. 6 is used as the operational amplifier circuits ($OPC_1$ to $OPC_N$ included within the output buffer 529 of FIG. 2) for driving data lines in the conventional active-matrix type of liquid-crystal device.

This class-AB operational amplifier circuit includes a differential section 610, a level shifter 620, and an output section 630.

In this case, the differential section 610 amplifies the differential value of differential signals (VIN and OUT). The level shifter 620 shifts the level of the voltage at an output node NQ1 of the differential section 610 and outputs it to a node N1. The output section 630 includes a p-type drive transistor PT55 having a gate electrode connected to the node N1, an n-type drive transistor NT55 having a gate electrode connected to the node NQ1, and a phase-compensation capacitance element CC.

In the conventional class-AB operational amplifier circuit shown in FIG. 6, the output section 630 has both the p-type drive transistor PT55 and the n-type drive transistor NT55. In the cases shown at A1 and A4 of FIG. 5, the voltage of the data line S can be quickly pulled down to the low-potential side by the operation of the n-type drive transistor NT55. In the cases shown at A2 and A3 in FIG. 5, on the other hand, the voltage of the data line S can be pulled up to the high-potential side by the operation of the p-type drive transistor PT55. The class-AB operational amplifier circuit of the configuration shown in FIG. 6 can therefore be used in most cases as an operational amplifier circuit including an output buffer for a data line drive circuit, in a liquid-crystal device that performs scan line inversion drive while inverting the polarity of the opposing electrode VCOM.

However, this class-AB operational amplifier circuit has a defect in that there are three paths along which current flows in (the paths of currents I1, I2, and I3), so a lot of current is consumed wastefully and thus the power consumption thereof is high. In this type of class-AB operational amplifier circuit it is common to have a configuration in which there are four or more current paths, in order to control the gate electrodes of the drive transistors PT55 and NT55 properly, and such a circuit configuration leads to an even greater power consumption. If the current flowing along these paths were to be restricted, in an attempt to reduce the power consumption, the amplification ratio and speed of response would then drop, leading to a state in which the frequency characteristic deteriorates.

Large numbers of the operational amplifier circuits of FIG. 6 are provided to correspond to the data lines shown in FIG. 2. For that reason, if the power consumption of each operational amplifier circuit increases, the power consumption of the entire liquid-crystal device increases by an amount equivalent to the number of operational amplifier circuits, which raises a problem in that this provides a large obstacle to the reduction in power consumption.

In order to solve this technical problem, this embodiment utilizes an operational amplifier circuit of the configuration described below.

2.2 Reduction in Power Consumption of Operation Amplifier Circuit

Figure 7A:
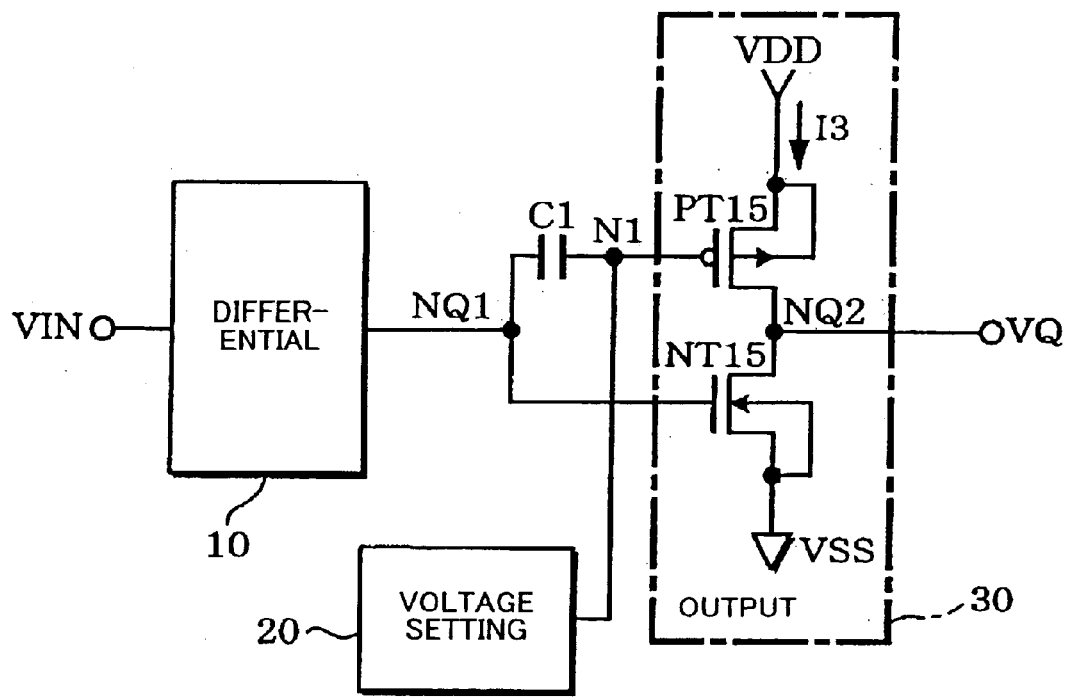
FIGS. 7A and 7B show examples of the structure of an operational amplifier circuit in accordance with this embodiment.

An example of the structure of the operational amplifier circuit of this embodiment is shown in FIG. 7A.

This operational amplifier circuit includes a differential section 10, a voltage setting circuit 20, and an output section 30.

In this case, the differential section 10 amplifies the differential value of differential signals (first and second differential signals). Taking voltage-follower connections as an example, an output VQ (the second differential signal) of the operational amplifier circuit is fed back to the differential section 10. The differential section 10 amplifies a differential value (differential voltage) obtained from the input VIN (the first differential signal) from the previous-stage circuit (the DAC 528 of FIG. 2) and the fed-back VQ (the second differential signal), and outputs the amplified voltage to the node NQ1.

The output section 30 includes a p-type drive transistor PT15 (a first drive transistor of a first conductivity type) that is provided on a VDD (a first power source) side. It also includes an n-type drive transistor NT15 (a second drive transistor of a second conductivity type) provided on a VSS (a second power source) side, in series with PT15.

In this case, a capacitance element C1 (a first capacitance element) is provided between the gate electrode (the node N1) of the p-type drive transistor PT15 and the output node NQ1 of the differential section 10. The gate electrode of the n-type drive transistor NTI5 is controlled by the output node NQ1 of the differential section 10.

The voltage setting circuit 20 sets a programming voltage (broadly speaking: a first voltage) to the node N1 that is connected to the gate electrode of the p-type drive transistor PT15. The generation of this programming voltage is based on the threshold voltage of a p-type (broadly speaking: a first conductivity type) transistor, by way of example.

With this embodiment, the voltage setting circuit 20 sets the programming voltage to the node N1 before the voltage at the output VQ (data line) of the operational amplifier circuit changes. A subsequent change in the voltage (AC component) at the output node NQ1 of the differential section 10 is transferred to the node N1 by the capacitance element C1 (capacitive coupling). This causes the application of a voltage, which is the voltage change (AC component) at NQ1 superimposed on the programming voltage (DC component), to the gate electrode of the drive transistor PT15, and the output VQ of the operational amplifier circuit changes.

The configuration of FIG. 7A makes the level shifter 620 unnecessary. Since the path along which the current I2 flows is thus removed, the power consumption of the operational amplifier circuit can be reduced in comparison with the configuration of FIG. 6.

The configuration of FIG. 6 has a problem in that, if an attempt is made to reduce the current I2 flowing along the path through the level shifter 620, the current I3 flowing along the path through the output section 630 will increase, whereas any attempt to reduce I3 will increase I2. This makes the circuit design difficult.

In contrast thereto, the configuration of FIG. 7A makes it unnecessary to consider the current I2 during the circuit design, thus simplifying the circuit design towards power reduction since only the current flowing along the path through the output section 630 need be considered.

In the configuration of FIG. 7A, the voltage at the node N1 is previously set to be the programming voltage which is on the order of (VDD−VTH) where VTH is the threshold voltage of the p-type transistor. It is therefore possible for this operational amplifier circuit to perform class-AB operation (push-pull operation), in a similar manner to FIG. 6. The voltage of the data line S can therefore be quickly pulled down to the low-potential side by the operation of the n-type drive transistor NT15. In the cases shown at A2 and A3 in FIG. 5, on the other hand, the voltage of the data line S can be pulled up to the high-potential side by the operation of the p-type drive transistor PT15. It is therefore possible to rapidly set the voltage on the data line to the target voltage, even when using scan line inversion drive while inverting the polarity of the opposing electrode VCOM.

Figure 7B:
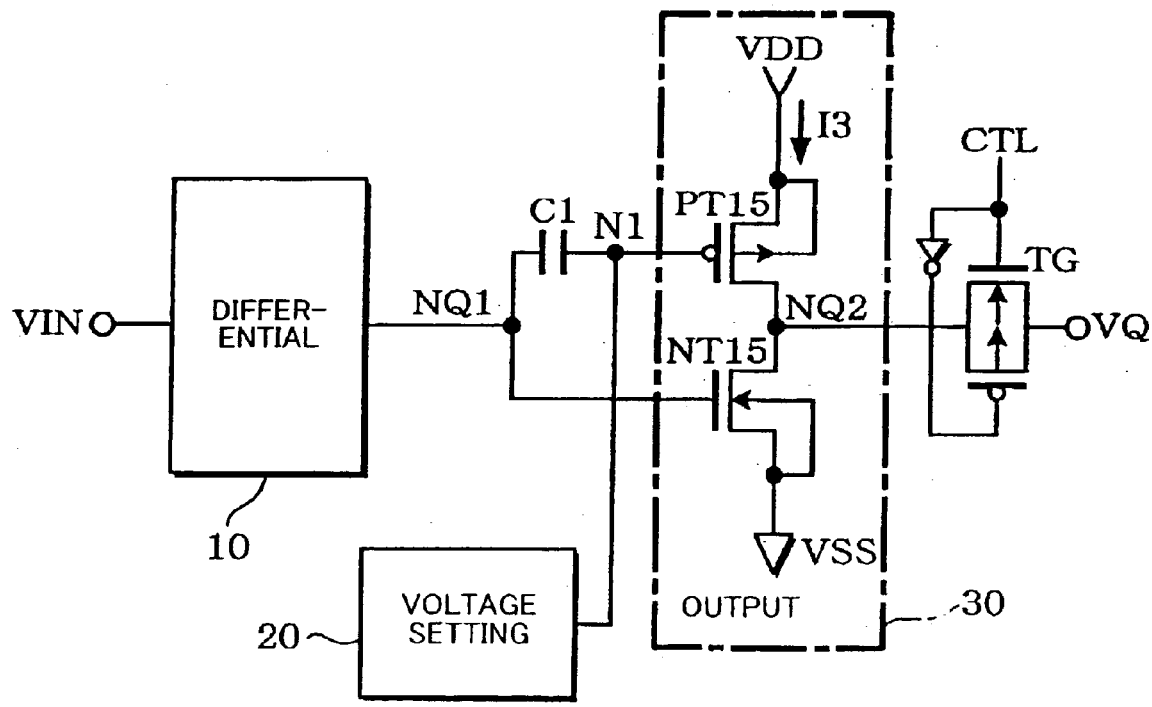

Note that it is desirable to provide a transfer gate TG (a sixth switching element) between the output node NQ2 of the voltage setting circuit 20 and the output VQ of the operational amplifier circuit, as shown in FIG. 7B. This transfer gate TG is configured by connecting drain electrodes of a p-type transistor and an n-type transistor and connecting source electrodes of the p-type transistor and the n-type transistor. A control signal CTL controls the turning on and off of the transfer gate TG.

It is possible to set the output VQ (the data line connected to VQ) of the operational amplifier circuit to a high-impedance state by turning off the transfer gate TG. More specifically, the transfer gate TG is turned off and the output VQ of the operational amplifier circuit is set to the high-impedance state during a switching period (a period of a given length, including switch timing) from a K-th scan period in which the K-th scan line is selected and a (K+1)th scan period in which the (K+1)th scan line is selected. Taking the scan line inversion drive of FIG. 4 as an example, TG is turned off and VQ is set to the high-impedance state at the timing at which the polarity of the voltage level of the opposing electrode VCOM changes.

The provision of this transfer gate TG makes it possible to prevent the transfer of an unsuitable voltage to the data line, when the voltage at the node N1 is still in an undefined state. In other words, the configuration is such that the output VQ of the operational amplifier circuit is set to the high-impedance state when the programming voltage (first voltage) is set to the node N1, and a voltage corresponding to the voltage change at the node NQ1 is output to the data line after that programming voltage has been set.

2.3 Detailed Example of Operational Amplifier Circuit

Figure 8:
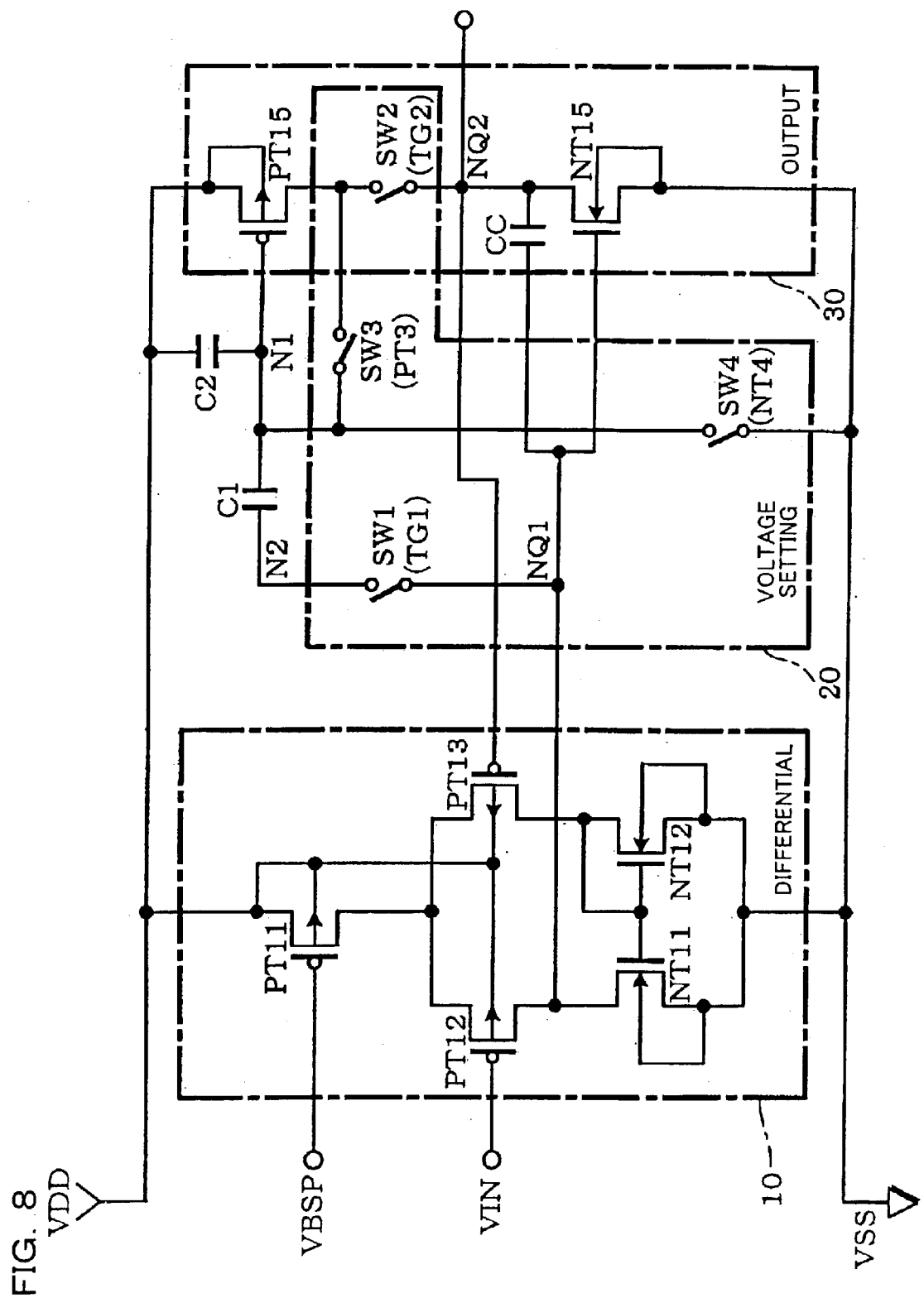
FIG. 8 shows a detailed example of the structure of the operational amplifier circuit of this embodiment.

A detailed example of the structure of the operational amplifier circuit is shown in FIG. 8. Note that the operational amplifier circuit of the present invention does not necessarily include all of the components shown in FIG. 8, and thus it could have a configuration where some of them are omitted. In addition, other components that are not shown in FIG. 8 could be added thereto.

In FIG. 8, the differential section 10 includes p-type transistor PT11 (current source) having a gate electrode to which a bias voltage VBSP is applied, and it further includes a p-type transistor PT12 having a gate electrode (a first input pin) to which is input VIN (the first differential signal) and a p-type transistor PT13 having a gate electrode (second input pin) to which is input the signal at the node NQ2 (the second differential signal). It also includes n-type transistors NT11 and NT12 having gate electrodes that are connected in common to the node NQ1. Note that the differential section 10 could be a circuit that enables at least the amplification of the differential value of differential signals, and circuits with various configurations that differ from FIG. 8 could be employed therefore.

The output section 30 includes the p-type drive transistor PT15 and the n-type drive transistor NT15, provided in series between VDD (the first power source) and VSS (the second power source). The capacitance element C1 (first capacitance element) is provided between the node N1 (first node) connected to the gate electrode of the p-type drive transistor PT15 and the node N2. In addition, a capacitance element C2 (a second capacitance element) is provided between the node N1 and VDD (the first power source). Note that CC denotes a phase-compensation capacitance element.

The voltage setting circuit 20 includes a switching element SW1 (a first switching element) that is provided between the output node NQ1 of the differential section 10 and the node N2. This SW1 could have the configuration of a transfer gate TG1. The voltage setting circuit 20 also includes a switching element SW2 (a second switching element) that is provided between the drain electrode of the p-type drive transistor PT15 and the output node NQ2 of the output section 30. This SW2 could have the configuration of a transfer gate TG2. The voltage setting circuit 20 further includes a switching element SW3 (a third switching element) that is provided between the drain electrode of the p-type drive transistor PT15 and the node N1. This switching element SW3 could be configured of a p-type transistor PT3, by way of example. The voltage setting circuit 20 yet further includes a switching element SW4 (a fourth switching element) that is provided between the node N1 and VSS (the second power source).

Note that the switching on and off of the switching elements SW1 to SW4 is controlled by a switching control circuit (not shown in the figure). In other words, control signals from this switching control circuit are input to the gate electrodes of TG1, TG2, PT3, and NT4 that configure SW1 to SW4, whereby the switching on and off of SW1 to SW4 is controlled.

The operation of the operational amplifier circuit of FIG. 8 will now be discussed with reference to FIGS. 9 and 10.

Figure 9:
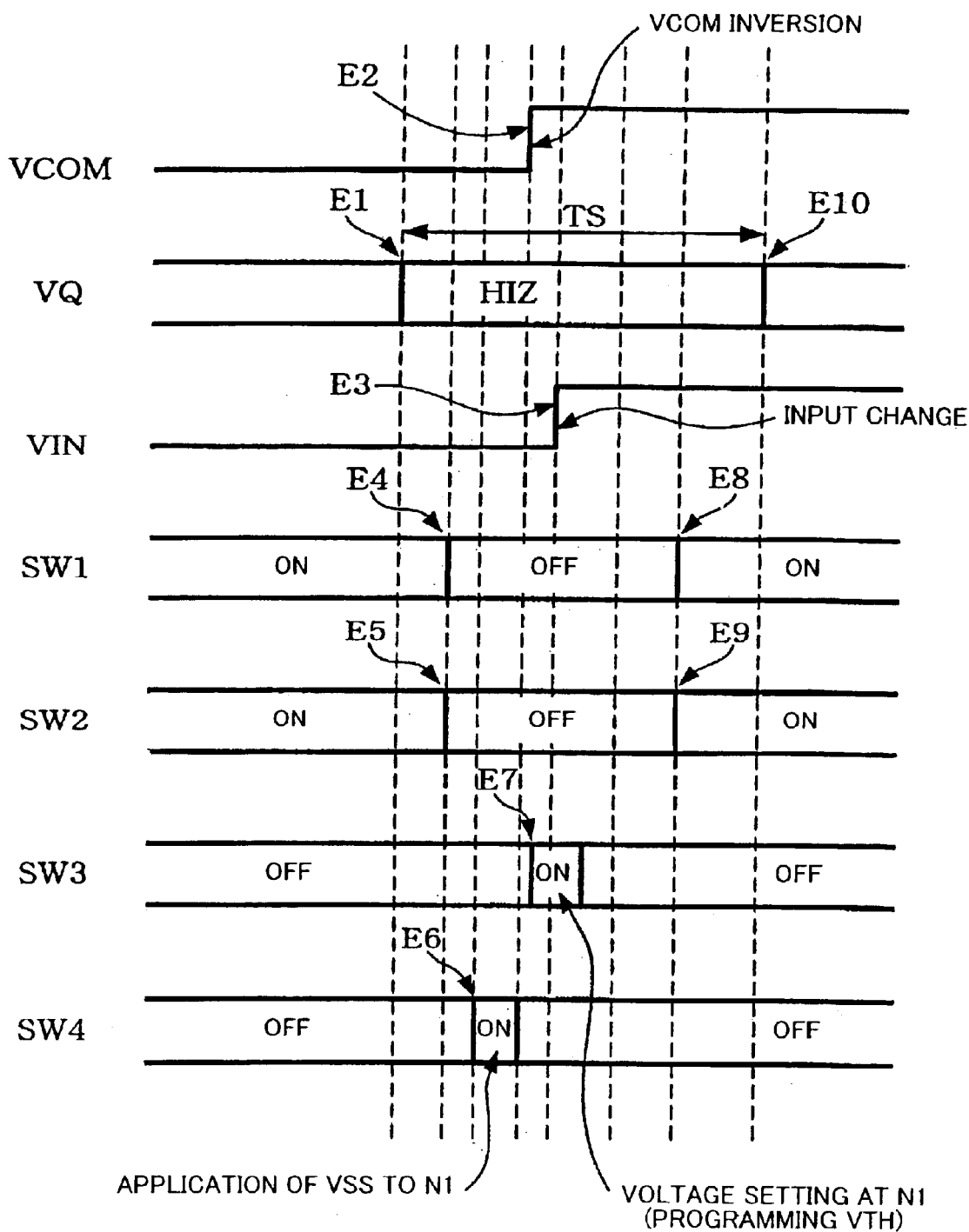
FIG. 9 is a timing waveform chart illustrative of the operation of the operational amplifier circuit of this embodiment.

First of all, the output VQ of the operational amplifier circuit is set to a high-impedance (HIZ) state (VQ and the data line S are disconnected), as shown at E1 in FIG. 9. This is implemented by turning off the transfer gate TG of FIG. 7B.

In FIG. 9, the polarity of the voltage at the opposing electrode VCOM inverts at the switch timing shown at E2. With this embodiment, the output VQ is in a high-impedance state during a switching period TS of a given length that includes this switch timing. The input VIN from the previous-stage circuit (the DAC 528 of FIG. 2) changes within this the switching period TS, as shown at E3.

The switching elements SW1 and SW2 are next turned off, as shown at E4 and E5 in FIG. 9. This prevents the voltage at the node NQ1 of FIG. 8 from transferring to the node N1, and also prevents the voltage at the drain electrode of the p-type drive transistor PT15 from transferring to the node NQ2.

The switching element SW4 then turns on, as shown at E6 in FIG. 9. This causes the voltage at the node N1 to be set to VSS (0 V), as shown at F1 in FIG. 10.

The switching element SW3 then turns on, as shown at E7 in FIG. 9. This connects the gate electrode and drain electrode of the drive transistor PT15. If the gate electrode and drain electrode are connected in this manner, the voltage of the node N1 is added from VSS by the turning on of the p-type drive transistor PT15 turns on, adding the voltage, as shown at F2 in FIG. 10. The voltage at the node N1 is set in the vicinity of (VDD−VTH), as shown at F3. In other words, a programming voltage (VDD−VTH) that is generated based on the threshold voltage VTH of the p-type drive transistor PT15 is set to the node N1.

The switching elements SW1 and SW2 then turn on, as shown at E8 and E9 in FIG. 9. The transfer gate TG (FIG. 7B) turns on, as shown at E10, and the output VQ of the operational amplifier circuit returns from the high-impedance state to the output enable state. This ensures that the operational amplifier circuit performs the normal class-AB operation, as shown at F4 in FIG. 10. This ensures that the voltage of the input VIN (the voltage from the DAC 528) is impedance-converted by the operational amplifier circuits in the voltage-follower connection, and is applied to the data line.

Figure 11:
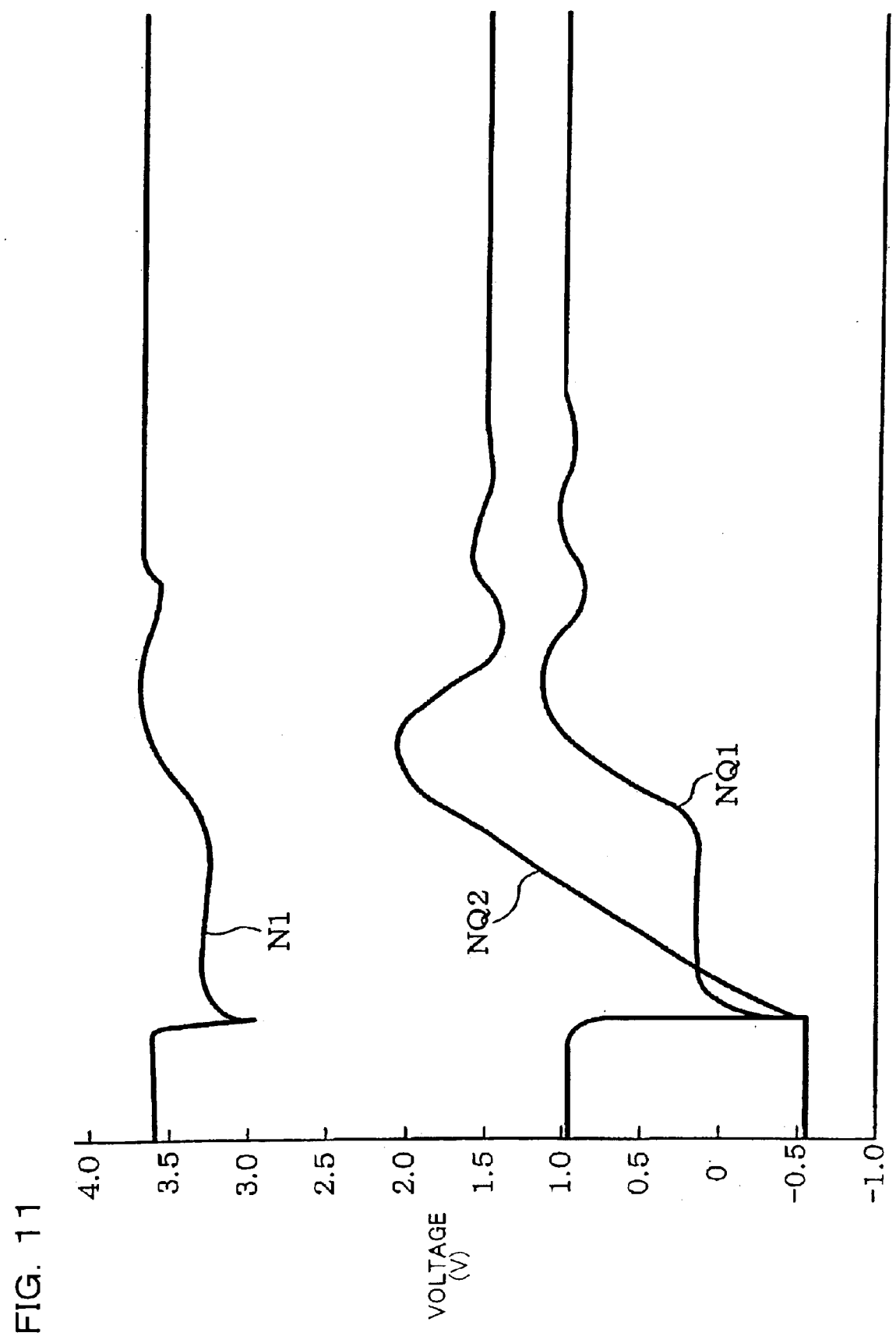
FIG. 11 shows the results of simulations on an operational amplifier circuit in accordance with this embodiment.
Figure 12:
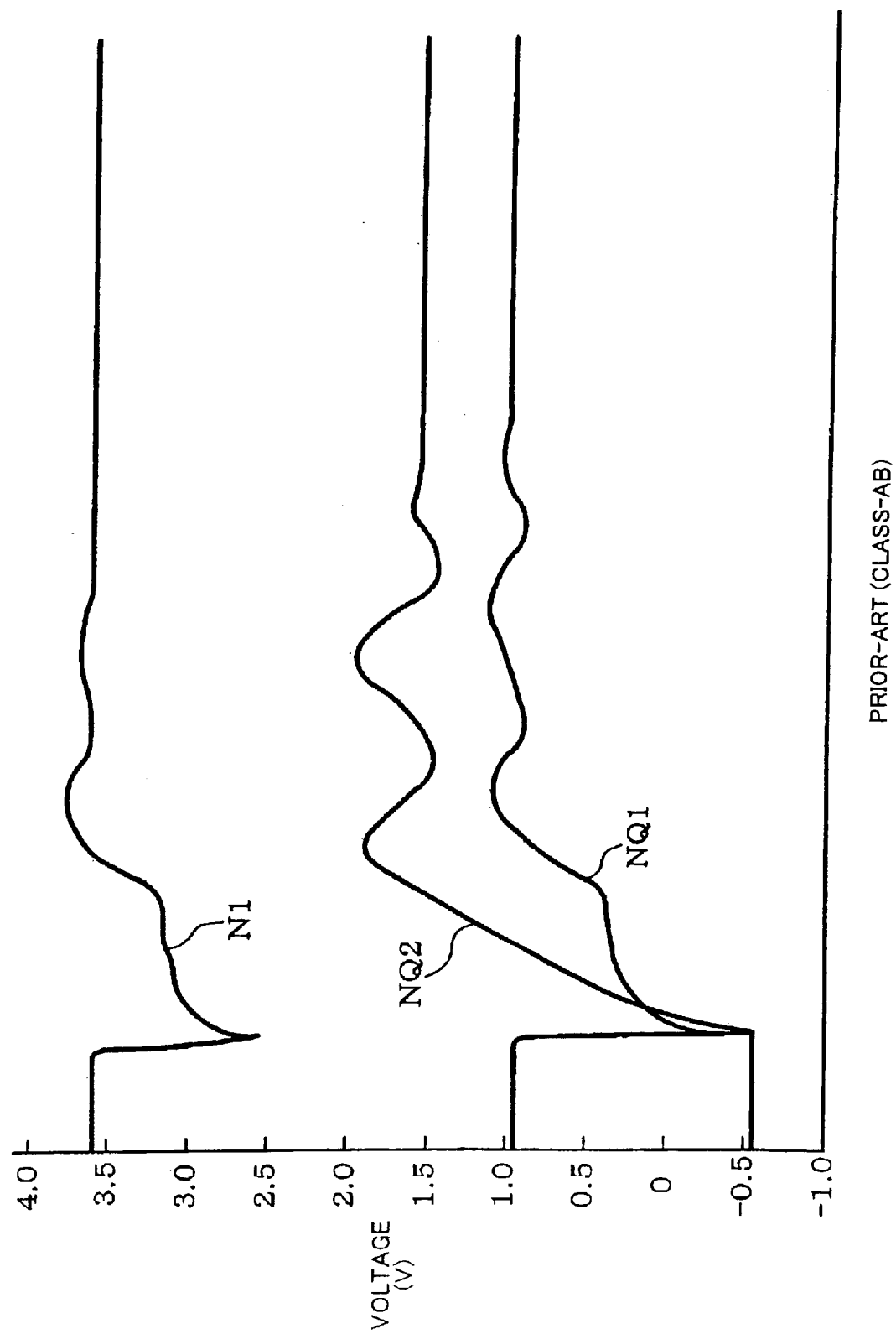
FIG. 12 shows the results of simulations on a conventional class-AB operational amplifier circuit.

The results of simulations of the voltage changes at the nodes NQ1, NQ2, and N1 of the operational amplifier circuit of this embodiment (voltage changes after the return to the output enable state) are shown in FIG. 11, and the results of simulations of the conventional class-AB operational amplifier circuit of FIG. 6 are shown in FIG. 12.

As is clear from a comparison of FIGS. 11 and 12, this embodiment enables class-AB operation even though the level shifter 620 of FIG. 6 is not provided.

In other words, in the cases shown at A1 and A4 in FIG. 5, the voltage of the data line S can be quickly pulled down to the low-potential side by the operation of the n-type drive transistor NT15 that changes the voltage of the gate electrode (the node NQ1) thereof within the range of 0 V to about 1.0 V. In the cases shown at A2 and A3 in FIG. 5, the voltage of the data line S can be pulled up to the high-potential side by the operation of the p-type drive transistor PT15 that changes the voltage of the gate electrode (node N1) thereof within the range of 3.0 to about 4.0 V.

The embodiment configured in this manner makes it possible to implement an operational amplifier circuit that is capable of class-AB operation at a low power consumption.

2.4 First Modification

Figure 13:
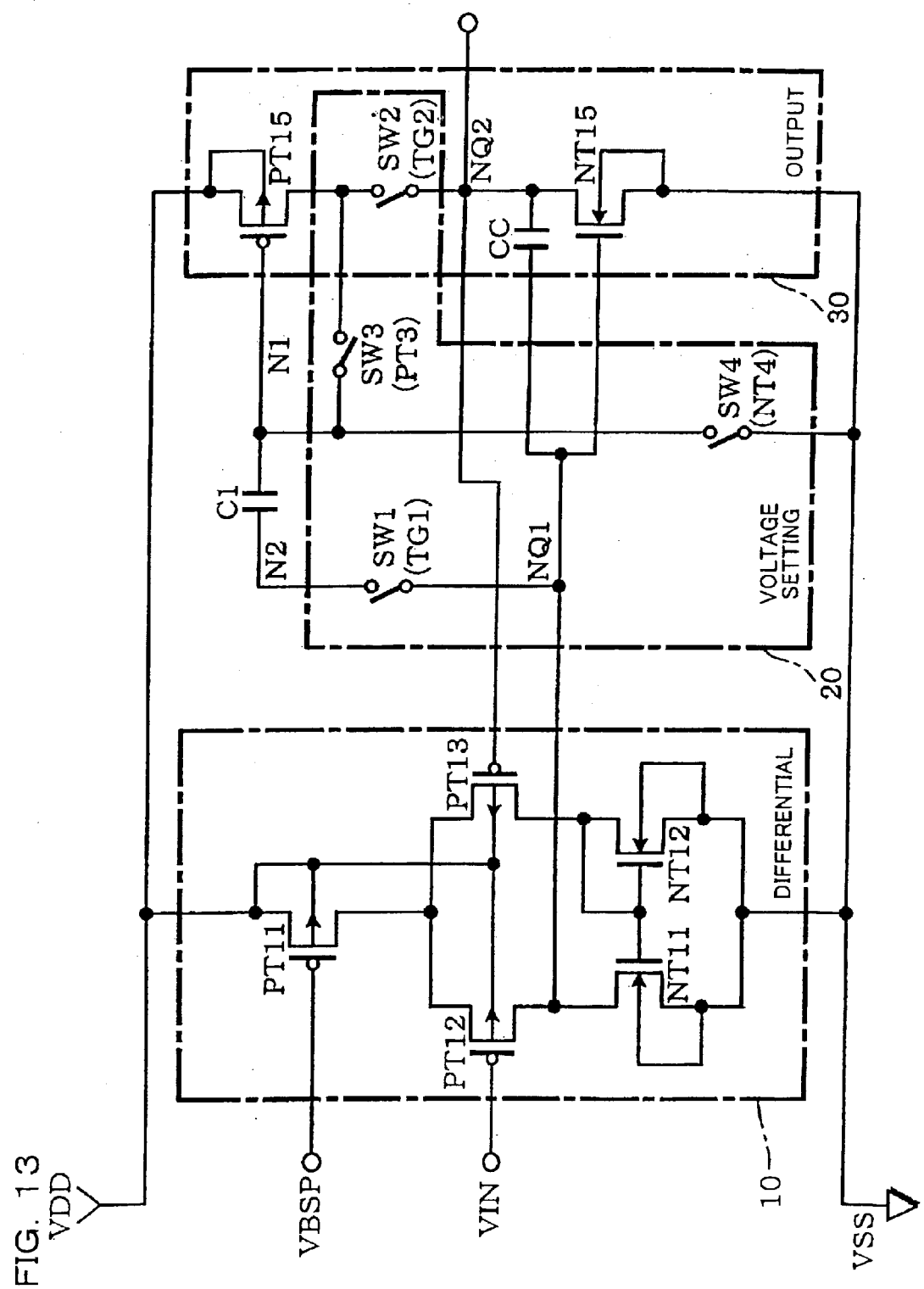
FIG. 13 shows a first modification of the operational amplifier circuit of this embodiment.

A first modification of the operational amplifier circuit of this embodiment is shown in FIG. 13. FIG. 13 differs from FIG. 8 in that the capacitance element C2 of FIG. 8 is not provided in FIG. 13.

In other words, the capacitance element C2 of FIG. 8 is replaced by the gate capacitance of the p-type drive transistor PT15 and the wiring capacitance at the node N1 (parasitic capacitance) in FIG. 13, by way of example. The configuration of FIG. 13 can be used if the gate capacitance of the p-type drive transistor PT15 is sufficiently large.

2.5 Second Modification

Figure 14:
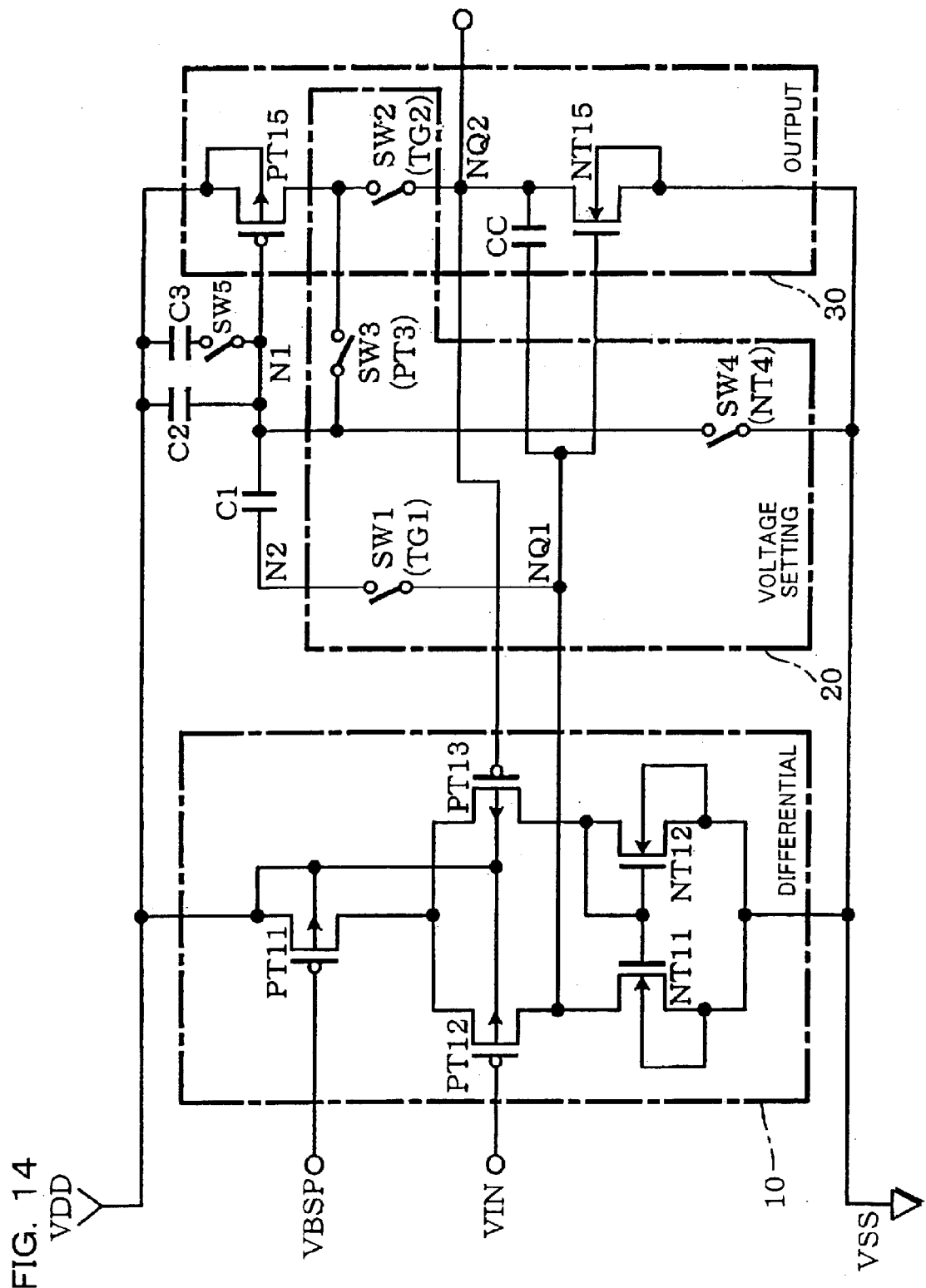
FIG. 14 shows a second modification of the operational amplifier circuit of this embodiment.

A second modification of the operational amplifier circuit of this embodiment is shown in FIG. 14. FIG. 14 differs from FIG. 8 in that a capacitance element C3 (a third capacitance element) and a switching element SW5 (a fifth switching element) are provided in series between VDD (the first power source) and the node N1, in the configuration of FIG. 13.

Figure 10:
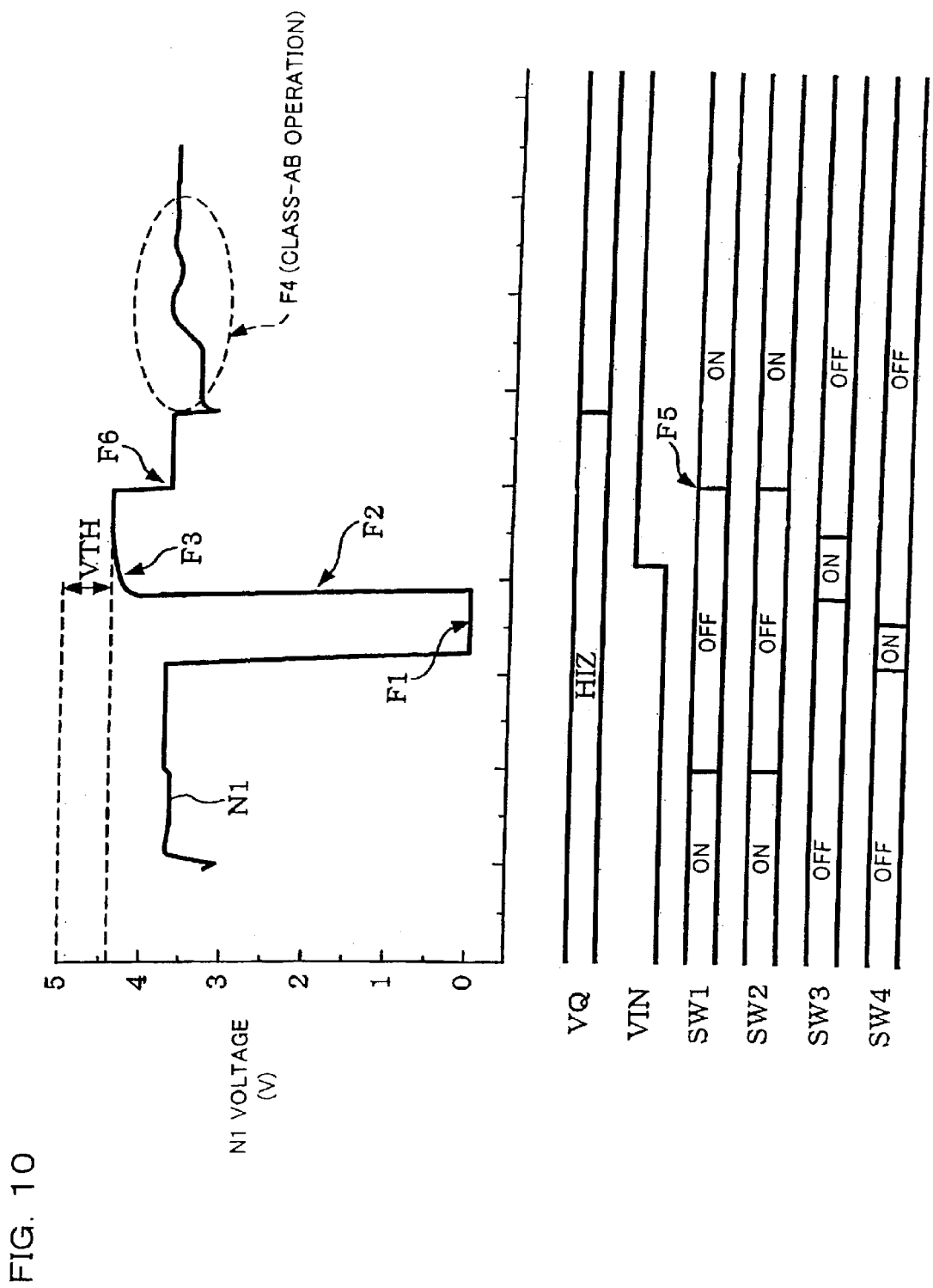
FIG. 10 a timing waveform chart further illustrative of the operation of the operational amplifier circuit of this embodiment.

If the switching element SW1 goes from off to on, as shown by way of example at F5 in FIG. 10, the voltage at the node N1 drops due to the capacitive coupling of the capacitance element C1, as shown at F6. As a result, the voltage of the node N1 changes from the programming voltage (VDD−VTH) to an even lower voltage level, during the class-AB operation.

To reduce the break-through current flowing along the path of the drive transistors PT15 and NT15 and reduce the power consumption, it is desirable to set the voltage of the node N1 to be in the vicinity of the programming voltage (VDD−VTH). In other words, the operational amplifier circuit is capable of class-AB operation with the p-type drive transistor PT15 in a weakly-on state. It is therefore desirable to minimize the voltage drop shown at F6 in FIG. 10, as far as possible.

The configuration of FIG. 14 enables variable control over the capacitance (C2+C3) between the power source VDD and the node N1, by controlling the switching element SW5. This makes it possible to minimize the voltage drop shown at F6 in FIG. 10, thus enabling a further reduction in the power consumption.

2.6 Third Modification

Figure 15:
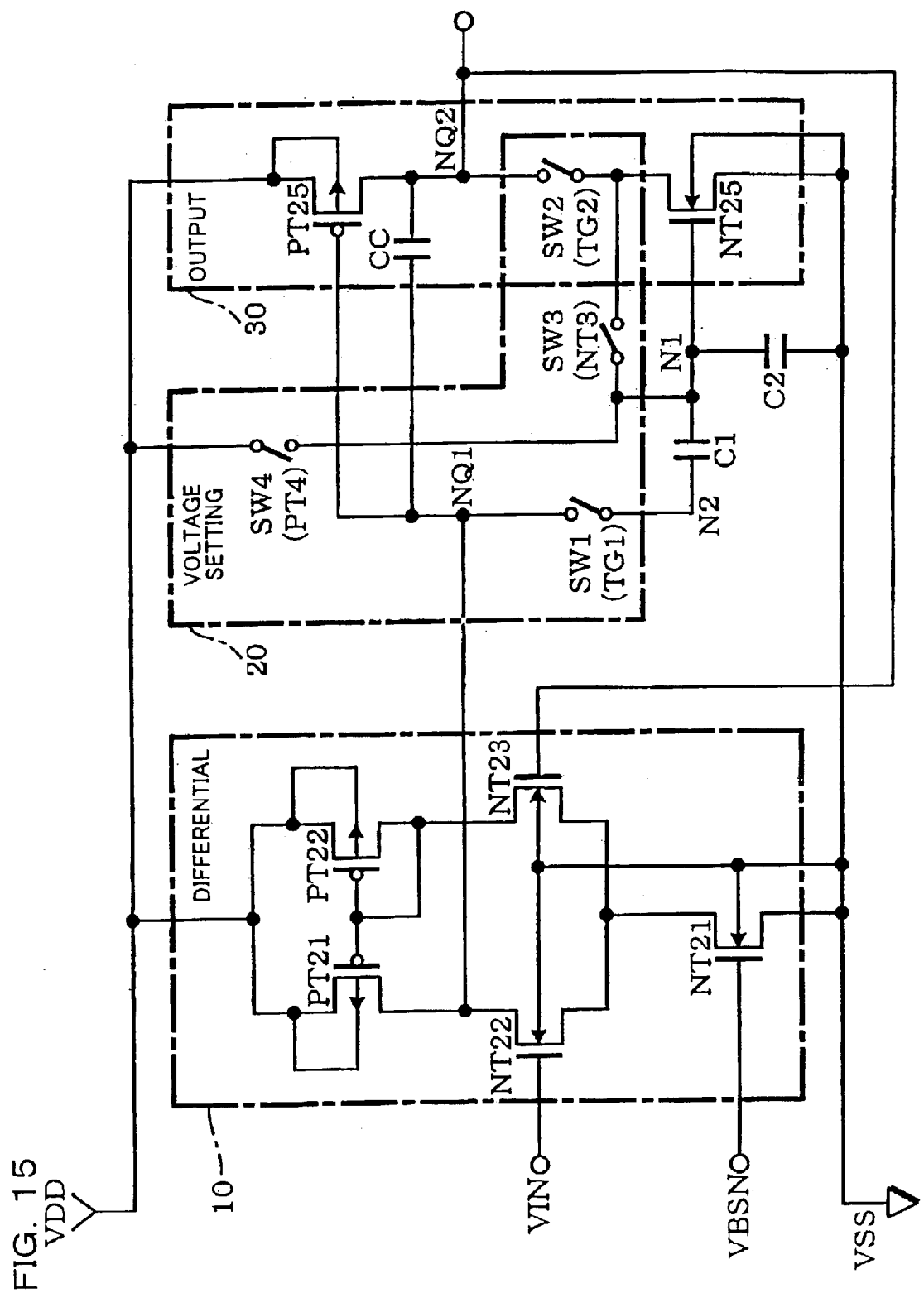
FIG. 15 shows a third modification of the operational amplifier circuit of this embodiment.

A third modification of the operational amplifier circuit of this embodiment is shown in FIG. 15. In contrast to FIG. 8, which shows an operational amplifier circuit in which differential signals (VIN and NQ2) are received by the p-type transistors PT12 and PT13, FIG. 15 relates to an operational amplifier circuit in which the differential signals are received by n-type transistors NT22 and NT23.

More specifically, the differential section 10 of FIG. 15 includes an n-type transistor NT21 (a current source) having a gate electrode to which a bias voltage VBSN is applied, n-type transistors NT22 and NT23 having gate electrodes connected to VIN and NQ2, and p-type transistors PT21 and PT22 having gate electrodes connected in common to NQ1.

The output section 30 includes an n-type drive transistor NT25 (a first drive transistor) and a p-type drive transistor PT25 (a second drive transistor), connected in series between VSS (the first power source) and VDD (the second power source). The capacitance element C1 (the first capacitance element) is provided between the nodes N1 and N2, and the capacitance element C2 (the second capacitance element) is provided between the node N1 and VSS (the first power source).

The voltage setting circuit 20 includes the switching element SW1 (first switching element), which is configured of the transfer gate TG1 and is provided between the nodes NQ1 and N2. It also includes the switching element SW2 (second switching element), which configured of the transfer gate TG2 and is provided between the drain electrode of the drive transistor NT25 and the node NQ2. It further includes the switching element SW3 (third switching element), which is configured of an n-type transistor NT3 and is provided between the drain electrode of the drive transistor NT25 and the node N1. It still further includes the switching element SW4 (fourth switching element). which is configured of a p-type transistor PT4 and is provided between the node N1 and VDD (the second power source).

The configuration of FIG. 15 also makes it possible to implement an operational amplifier circuit that is capable of class-AB operation at a low power consumption. Note that the programming voltage applied to the node N1 in the configuration of FIG. 14 is in the vicinity of (VSS+VTH), by way of example.

2.7 Fourth Modification

Figure 16:
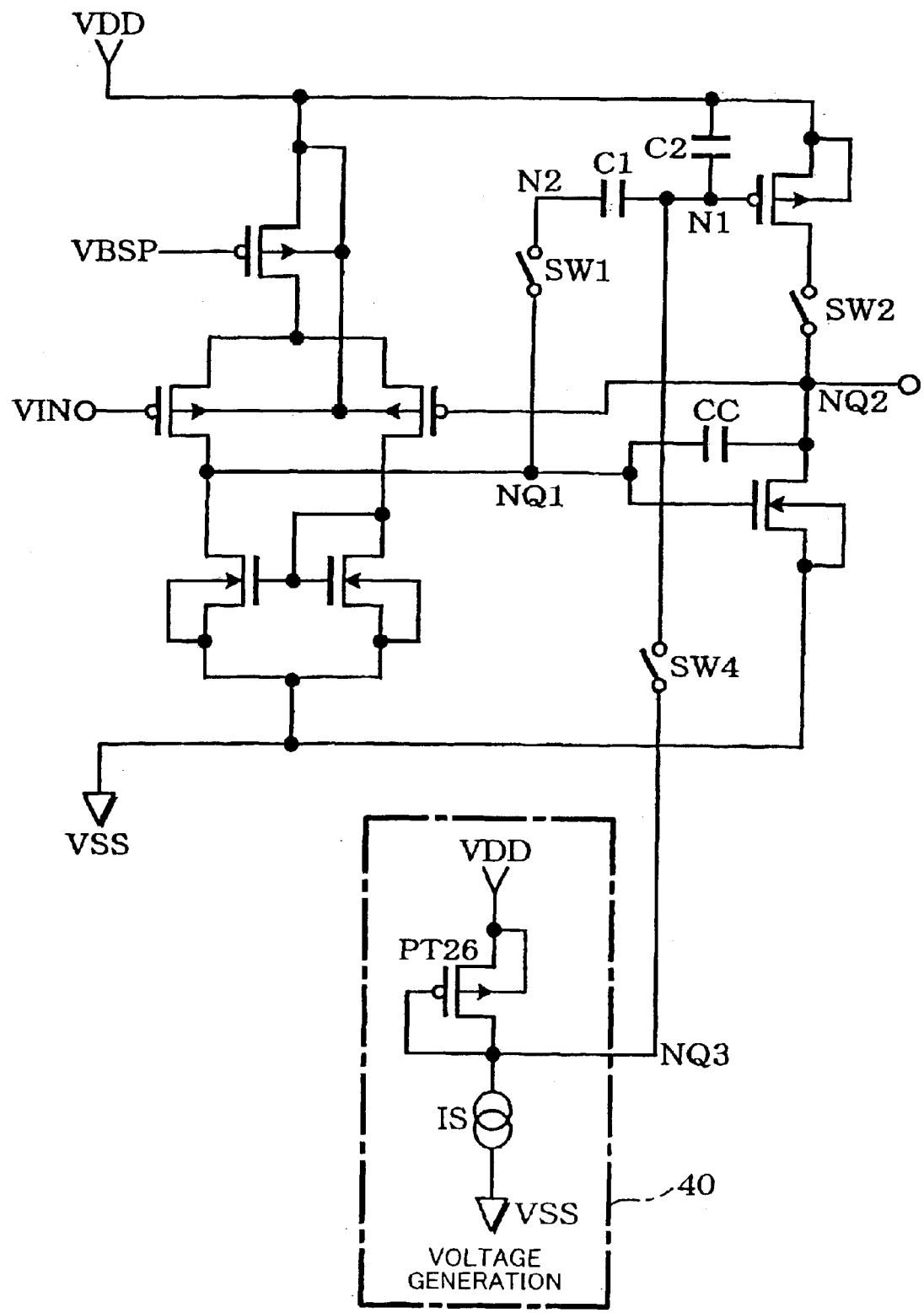
FIG. 16 shows a fourth modification of the operational amplifier circuit of this embodiment.

A fourth modification of the operational amplifier circuit of this embodiment is shown in FIG. 16.

In FIG. 8, the switching element SW3 was provided and the programming voltage was set at the node N1 by turning SW3 on.

In contrast thereto, the switching element SW3 is not provided in the operational amplifier circuit of FIG. 16, but a voltage generation circuit 40 that generates a voltage (constant voltage) corresponding to a threshold voltage is provided instead. The switching element SW4 is provided between the node N1 and an output node NQ3 of the voltage generation circuit 40.

The voltage generation circuit 40 of FIG. 16 includes a p-type transistor PT26 (a transistor of a first conductivity type), with gate and drain electrodes connected together, and a current source IS provided in series with PT26. In this case, the current source IS could be implemented by components such as an n-type transistor with a bias voltage input to the gate terminal thereof and a resistive element.

This voltage generation circuit 40 enables the generation of a programming voltage (VDD−VTH) at the node NQ3, corresponding to the threshold voltage. It is also possible to set the programming voltage (VDD−VTH) at the node N1, by turning on the switching element SW4 at the timing of E6 in FIG. 9. This enables the implementation of an operation similar to that of FIG. 8.

Note that the voltage generation circuit 40 is not limited to the circuit configuration shown in FIG. 16. For example, another configuration could be used to generate a voltage (constant voltage) corresponding to a threshold voltage (the threshold voltage of a p-type or n-type transistor). Alternatively, a circuit that generates multiple drive voltages (multiple power voltages) for driving a liquid-crystal device (broadly speaking: a electro-optical device) could be used as the voltage generation circuit 40 of FIG. 16. In other words, the configuration could be such that a voltage in the vicinity of (VDD−VTH) or (VSS+VTH), which is the programming voltage, could be selected from these multiple drive voltages and applied to the node NQ3.

2.8 Fifth Modification

Figure 17:
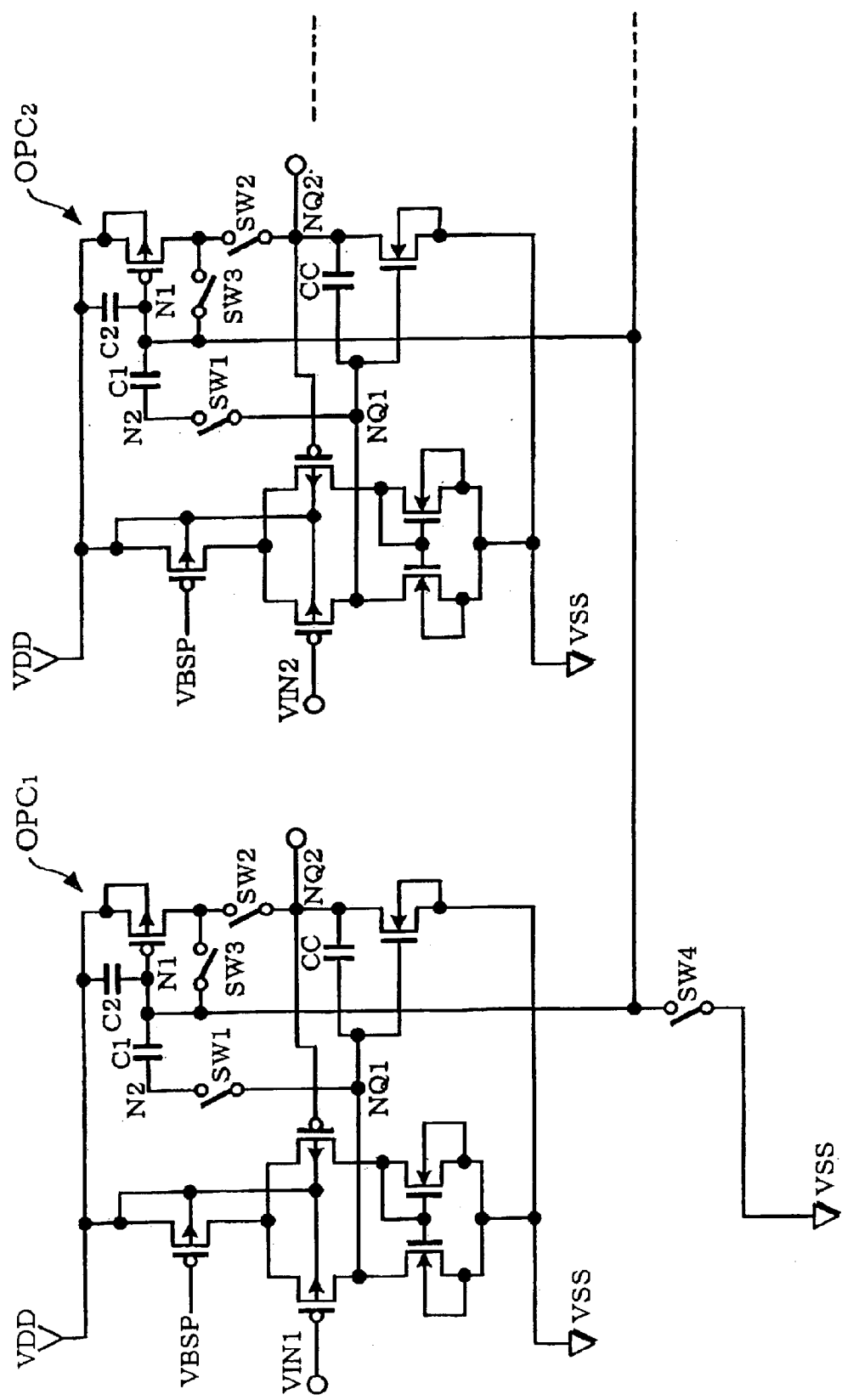
FIG. 17 shows a fifth modification of the operational amplifier circuit of this embodiment.

A fifth modification of the operational amplifier circuit of this embodiment is shown in FIG. 17.

IN FIG. 17, the switching element SW4 (fourth switching element) is used in common by a plurality (at least two) of the operational amplifier circuits $OPC_1$ to $OPC_N$ included within the output buffer 529 of FIG. 2. In other words, the switching element SW4 is provided in common between the node N1 of the operational amplifier circuits $OPC_1$ to $OPC_N$ and the power source VSS.

This enables a reduction in scale of the operational amplifier circuit, since it suffices to provide only one switching element SW4 for a plurality of operational amplifier circuits.

2.9 Sixth Modification

Figure 18:
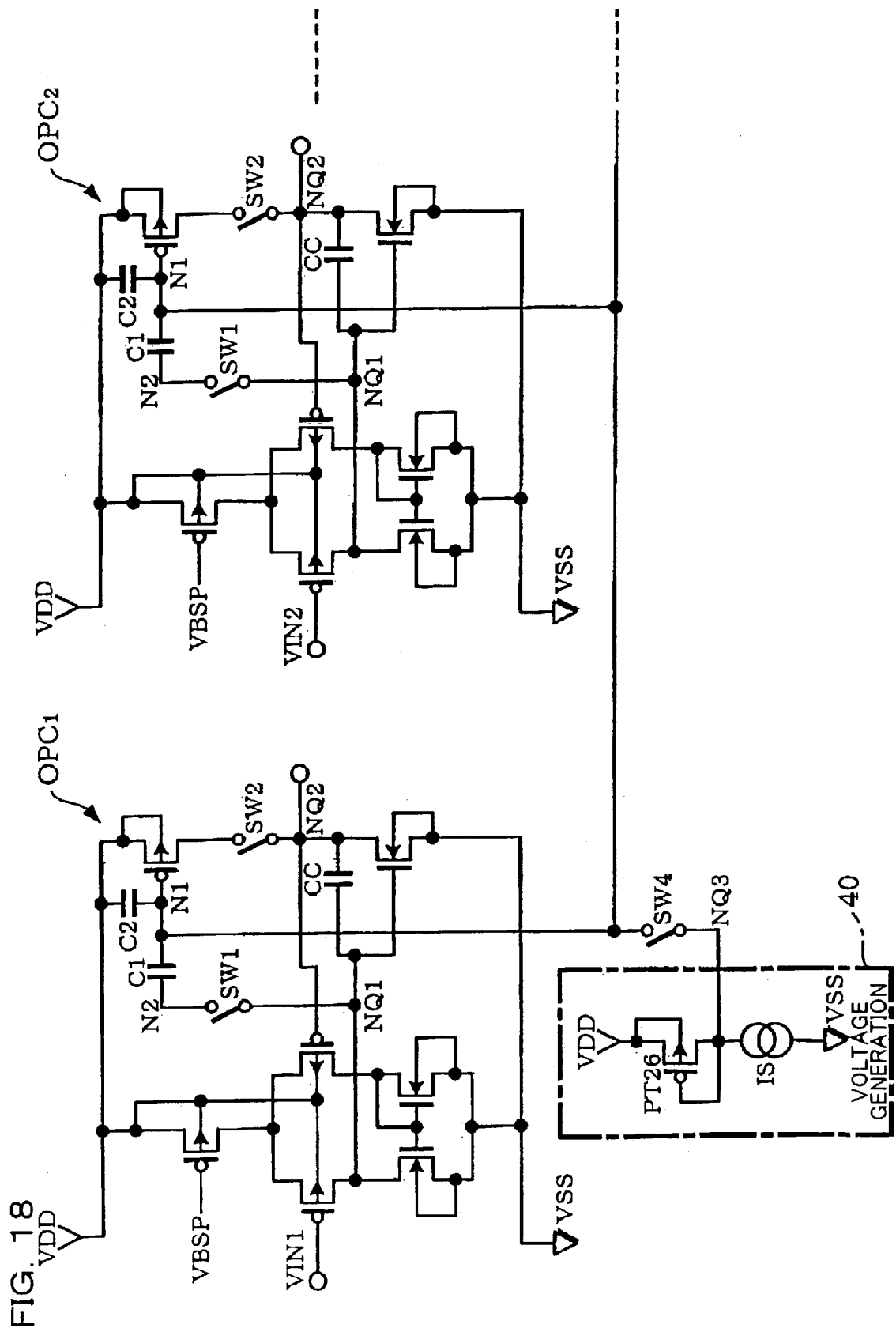
FIG. 18 shows a sixth modification of the operational amplifier circuit of this embodiment.

A sixth modification of the operational amplifier circuit of this embodiment is shown in FIG. 18. FIG. 18 shows a variation that combines the configurations of FIGS. 16 and 17.

In FIG. 18, the switching element SW3 is not provided for each operational amplifier circuit; instead, the voltage generation circuit 40 is provided to generate a voltage corresponding to the threshold voltage.

In such a case, the voltage generation circuit 40 is used in common for the plurality of operational amplifier circuits. The switching element SW4 is also used in common for the plurality of operational amplifier circuits.

This makes it possible to provide only one each of the switching element SW4 and the voltage generation circuit 40 for the plurality of operational amplifier circuits. In addition, it also makes it possible to not provide the switching element SW3 in the operational amplifier circuit. This enables a further reduction in scale of the operational amplifier circuit.

Note that the present invention is not limited to this embodiment and thus various modification thereof are possible within the scope of the invention laid out herein.

For example, this embodiment was described as relating to the application of the operational amplifier circuit of the present invention to the output buffer of an active-matrix type of liquid-crystal device that uses TFTs, but the present invention is not limited thereto. It is also possible to apply it to a circuit other than an output buffer (such as a power circuit), or to a liquid-crystal device that is not an active-matrix type of liquid-crystal device, or to another type of electro-optical device such as an electroluminescence (EL) device, organic EL device, or plasma display device, by way of example.

The configuration of the operational amplifier circuit is also not limited to that described with reference to FIGS. 7A, 7B, 8, and 13 to 18, and thus is can be applied to various equivalent configurations. For example, the operational amplifier circuit could combine the configurations shown in FIGS. 7A, 7B, 8, and 13 to 18.

The present invention is also not limited to a scan line inversion drive, and thus it can be applied to devices using other inversion drive methods.

Terminology (such as VDD, VSS, p-type, n-type, and liquid-crystal device) that is derived from general terminology given in this document (such as first power source, second power source, first conductivity type, second conductivity type, and electro-optical device) can also be replaced by other general terminology within this document.

It is possible for an aspect of the present invention that is defined by a dependent claim to omit some of the configurational requirements of the corresponding antecedent claim. Similarly, the components of the present invention defined by an independent claim can also be allocated to other independent claims.

What is claimed is:

1. An operational amplifier circuit comprising:

a differential section which amplifies a differential value of differential signals;

an output section including a first drive transistor of a first conductivity type and a second drive transistor of a second conductivity type, the first drive transistor being provided on a first power source side, the second drive transistor being provided in series with the first drive transistor and provided on a second power source side, and a gate electrode of the second drive transistor being controlled based on a voltage at an output node of the differential section;

a voltage setting circuit which sets a given first voltage to a first node connected to a gate electrode of the first drive transistor; and a first capacitance element provided between an output node of the differential section and the first node, wherein the voltage setting circuit sets the first voltage to the first node, and then the first capacitance element transfers a voltage change at the output node of the differential section to the first node.

2. The operational amplifier circuit as defined by claim 1, wherein the voltage setting circuit includes:

a first switching element provided between an output node of the differential section and the first capacitance element; and a second switching element provided between a drain electrode of the first drive transistor and an output node of the output section, wherein the first and second switching elements are turned off before the first voltage is set to the first node and are turned on after the first voltage is set to the first node.

3. The operational amplifier circuit as defined by claim 1, wherein the voltage setting circuit includes a third switching element provided between the first node and a drain electrode of the first drive transistor, and wherein the first voltage is set to the first node by turning on the third switching element.

4. The operational amplifier circuit as defined by claim 2, wherein the voltage setting circuit includes a third switching element provided between the first node and the drain electrode of the first drive transistor, and wherein the first voltage is set to the first node by turning on the third switching element.

5. The operational amplifier circuit as defined by claim 3, wherein the voltage setting circuit includes a fourth switching element provided between the first node and the second power source, and wherein a voltage of the second power source is set to the first node by turning on the fourth switching element, and then the fourth switching element is turned off and the third switching element is turned on.

6. The operational amplifier circuit as defined by claim 4, wherein the voltage setting circuit includes a fourth switching element provided between the first node and the second power source, and wherein a voltage of the second power source is set to the first node by turning on the fourth switching element, and then the fourth switching element is turned off and the third switching element is turned on.

7. The operational amplifier circuit as defined by claim 1, further comprising:

a second capacitance element provided between the first power source and the first node.

8. The operational amplifier circuit as defined by claim 2, further comprising:

a second capacitance element provided between the first power source and the first node.

9. The operational amplifier circuit as defined by claim 3, further comprising:

a second capacitance element provided between the first power source and the first node.

10. The operational amplifier circuit as defined by claim 1, wherein the first voltage is a voltage obtained based on a threshold voltage of a transistor of the first conductivity type.

11. The operational amplifier circuit as defined by claim 2, wherein the first voltage is a voltage obtained based on a threshold voltage of a transistor of the first conductivity type.

12. The operational amplifier circuit as defined by claim 3, wherein the first voltage is a voltage obtained based on a threshold voltage of a transistor of the first conductivity type.

13. A drive circuit which drives an electro-optical device having a plurality of scan lines, a plurality of data lines and pixel electrodes specified by the data lines and the scan lines, and the drive circuit comprising:

the operational amplifier circuit as defined by claim 1, provided for each of the data lines; and a data voltage generation circuit provided for each of the data lines, the data voltage generation circuit generating a data voltage which is impedance-converted by the operational amplifier circuit, wherein the setting of the first voltage to the first node of the operational amplifier circuit is executed during a switching period from a K-th scan period to a (K+1)th scan period.

14. A drive circuit which drives an electro-optical device having a plurality of scan lines, a plurality of data lines and pixel electrodes specified by the data lines and the scan lines, and the drive circuit comprising:

the operational amplifier circuit as defined by claim 2, provided for each of the data lines; and a data voltage generation circuit provided for each of the data lines, the data voltage generation circuit generating a data voltage which is impedance-converted by the operational amplifier circuit, wherein the setting of the first voltage to the first node of the operational amplifier circuit is executed during a switching period from a K-th scan period to a (K+1)th scan period.

15. A drive circuit which drives an electro-optical device having a plurality of scan lines, a plurality of data lines and pixel electrodes specified by the data lines and the scan lines, and the drive circuit comprising:

the operational amplifier circuit as defined by claim 3, provided for each of the data lines; and a data voltage generation circuit provided for each of the data lines, the data voltage generation circuit generating a data voltage which is impedance-converted by the operational amplifier circuit, wherein the setting of the first voltage to the first node of the operational amplifier circuit is executed during a switching period from a K-th scan period to a (K+1)th scan period.

16. The drive circuit as defined by claim 13, wherein an output node of the operational amplifier circuit is set to a high-impedance state in the switching period.

17. The drive circuit as defined by claim 14, wherein an output node of the operational amplifier circuit is set to a high-impedance state in the switching period.

18. The drive circuit as defined by claim 15, wherein an output node of the operational amplifier circuit is set to a high-impedance state in the switching period.

19. A method of controlling an operational amplifier circuit, wherein the operational amplifier circuit comprises:
 a differential section which amplifies a differential value of differential signals;
 an output section including a first drive transistor of a first conductivity type and a second drive transistor of a second conductivity type, the first drive transistor being provided on a first power source side, the second drive transistor being provided in series with the first drive transistor and provided on a second power source side, and a gate electrode of the second drive transistor being controlled based on a voltage at an output node of the differential section, wherein the method comprises:
 setting a first voltage to a first node connected to the gate electrode of the first drive transistor; and
 transferring a change in voltage at the output node of the differential section to the first node by a first capacitance element.

20. The method of controlling an operational amplifier circuit as defined by claim 19, comprising:

turning off a first connection and a second connection before the first voltage is set to the first node, turning on the first connection and the second connection after the first voltage is set to the first node, the first connection being a connection between an output node of the differential section and the first capacitance element, and the second connection being a connection between a drain electrode of the first drive transistor and an output node of the output section.

21. The method of controlling an operational amplifier circuit as defined by claim 19, comprising:

setting the first voltage to the first node by turning on a third connection between the first node and a drain electrode of the first drive transistor.

22. The method of controlling an operational amplifier circuit as defined by claim 20, comprising:

setting the first voltage to the first node by turning on a third connection between the first node and the drain electrode of the first drive transistor.

23. The method of controlling an operational amplifier circuit as defined by claim 21, comprising:

setting a voltage of the second power voltage to the first node by turning on a fourth connection between the first node and the second power source, and then turning off the fourth connection and turning on the third connection.

24. The method of controlling an operational amplifier circuit as defined by claim 22, comprising:

setting a voltage of the second power voltage to the first node by turning on a fourth connection between the first node and the second power source, and then turning off the fourth connection and turning on the third connection.

25. The method of controlling an operational amplifier circuit as defined by claim 19, comprising:

setting the first voltage to a voltage obtained based on a threshold voltage of a transistor of the first conductivity type.

26. The method of controlling an operational amplifier circuit as defined by claim 20, comprising:

setting the first voltage to a voltage obtained based on a threshold voltage of a transistor of the first conductivity type.

27. The method of controlling an operational amplifier circuit as defined by claim 21, comprising:

setting the first voltage to a voltage obtained based on a threshold voltage of a transistor of the first conductivity type.

* * * * *